(12) United States Patent
Gardner et al.

(10) Patent No.: US 12,538,520 B2
(45) Date of Patent: Jan. 27, 2026

(54) 3D HIGH DENSITY SELF-ALIGNED NANOSHEET DEVICE FORMATION WITH EFFICIENT LAYOUT AND DESIGN

(71) Applicant: Tokyo Electron Limited, Tokyo (JP)

(72) Inventors: Mark I. Gardner, Cedar Creek, TX (US); H. Jim Fulford, Marianna, FL (US); Partha Mukhopadhyay, Oviedo, FL (US)

(73) Assignee: Tokyo Electron Limited, Tokyo (JP)

( * ) Notice: Subject to any disclaimer, the term of this patent is extended or adjusted under 35 U.S.C. 154(b) by 912 days.

(21) Appl. No.: 17/714,678

(22) Filed: Apr. 6, 2022

(65) Prior Publication Data

US 2023/0056372 A1    Feb. 23, 2023

Related U.S. Application Data

(60) Provisional application No. 63/235,281, filed on Aug. 20, 2021.

(51) Int. Cl.
| | |
|---|---|
| *H10D 30/67* | (2025.01) |
| *H10D 62/10* | (2025.01) |
| *H10D 64/23* | (2025.01) |
| *H10D 84/03* | (2025.01) |
| *H10D 88/00* | (2025.01) |

(52) U.S. Cl.
CPC ..... *H10D 30/6735* (2025.01); *H10D 30/6757* (2025.01); *H10D 62/118* (2025.01); *H10D 64/258* (2025.01); *H10D 84/038* (2025.01); *H10D 88/00* (2025.01); *H10D 88/01* (2025.01)

(58) Field of Classification Search
None
See application file for complete search history.

(56) References Cited

U.S. PATENT DOCUMENTS

| | | | |
|---|---|---|---|
| 2020/0135929 A1* | 4/2020 | Van Dal | H10D 30/6735 |
| 2021/0104522 A1* | 4/2021 | Gardner | H10D 62/80 |
| 2022/0037497 A1* | 2/2022 | Chung | H10D 84/0158 |
| 2023/0128495 A1* | 4/2023 | Fulford | H10D 62/118 |
| | | | 257/315 |
| 2023/0163185 A1* | 5/2023 | Fulford | H10D 30/014 |
| | | | 257/233 |

* cited by examiner

*Primary Examiner* — Anthony Ho
(74) *Attorney, Agent, or Firm* — Oblon, McClelland, Maier & Neustadt, L.L.P.

(57) ABSTRACT

A method of microfabrication includes forming an initial stack of semiconductor layers by epitaxial growth over a substrate. The initial stack of semiconductor layers is surrounded by a sidewall structure. The initial stack of semiconductor layers includes channel structures and sacrificial gate layers stacked alternatingly in a vertical direction substantially perpendicular to a working surface of the substrate. The channel structures include a first channel structure and a second channel structure positioned above the first channel structure. First portions of the sidewall structure are removed to uncover first sides of the initial stack. Source/drain (S/D) regions are formed on uncovered side surfaces of the channel structures from the first sides of the initial stack. Second portions of the sidewall structure are removed to uncover second sides of the initial stack. The sacrificial gate layers are replaced with gate structures from the second sides of the initial stack.

20 Claims, 20 Drawing Sheets

3D HIGH DENSITY SELF-ALIGNED NANOSHEET DEVICE FORMATION WITH EFFICIENT LAYOUT AND DESIGN

INCORPORATION BY REFERENCE

This present disclosure claims the benefit of U.S. Provisional Application No. 63/235,281, filed on Aug. 20, 2021, which is incorporated herein by reference in its entirety. Aspects of the present disclosure are related to Applicant's patent application titled "COMPACT 3D DESIGN AND CONNECTIONS WITH OPTIMUM 3D TRANSISTOR STACKING", which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and a method of microfabrication.

Aspect (1) includes a method of microfabrication. The method includes forming an initial stack of semiconductor layers by epitaxial growth over a substrate. The initial stack of semiconductor layers includes channel structures and sacrificial gate layers stacked alternatingly in a vertical direction substantially perpendicular to a working surface of the substrate. The channel structures include a first channel structure and a second channel structure positioned above the first channel structure. The initial stack of semiconductor layers is surrounded by a sidewall structure. First portions of the sidewall structure are removed to uncover first sides of the initial stack. Source/drain (S/D) regions are formed on uncovered side surfaces of the channel structures from the first sides of the initial stack. Second portions of the sidewall structure are removed to uncover second sides of the initial stack. The sacrificial gate layers are replaced with gate structures from the second sides of the initial stack.

Aspect (2) includes the method of Aspect (1), wherein the forming the S/D regions includes forming a protective structure to cover respective side surfaces of the second channel structure from the first sides of the initial stack. First S/D regions of the S/D regions are formed on respective side surfaces of the first channel structure.

Aspect (3) includes the method of Aspect (1), further including depositing a first filler material to cover the respective side surfaces of the first channel structure from the first sides of the initial stack. The protective structure is formed over the first filler material while leaving the first filler material partially uncovered. The first filler material is selectively etched to uncover the respective side surfaces of the first channel structure.

Aspect (4) includes the method of Aspect (1), wherein the forming the protective structure includes depositing a second filler material over the first filler material to cover the respective side surfaces of the second channel structure. The first filler material and the second filler material are etch selective to each other. The second filler material is directionally etched to partially uncover the first filler material such that a remaining portion of the second filler material forms the protective structure.

Aspect (5) includes the method of Aspect (1), further including removing the protective structure and forming second S/D regions of the S/D regions on the respective side surfaces of the second channel structure.

Aspect (6) includes the method of Aspect (1), wherein the sacrificial gate layers include one or more first sacrificial gate layers in direct contact with the first channel structure and one or more second sacrificial gate layers in direct contact with the second channel structure. The replacing the sacrificial gate layers with the gate structures includes forming a protective structure to cover respective side surfaces of the one or more second sacrificial gate layers from the second sides of the initial stack. The one or more first sacrificial gate layers are replaced with one or more first gate structures.

Aspect (7) includes the method of Aspect (6), further including removing the protective structure and replacing the one or more second sacrificial gate layers with one or more second gate structures.

Aspect (8) includes the method of Aspect (7), further including forming an isolation structure between the one or more first gate structures and the one or more second gate structures.

Aspect (9) includes the method of Aspect (6), wherein the removing the second portions of the sidewall structure includes removing upper parts of the second portions of the sidewall structure before the forming the protective structure. Lower parts of the second portions of the sidewall structure are removed after the forming the protective structure.

Aspect (10) includes the method of Aspect (1), further including forming indentations by removing end portions of the sacrificial gate layers from the first sides of the initial stack. Inner spacers are formed in the indentations.

Aspect (11) includes the method of Aspect (1), wherein the replacing the sacrificial gate layers with the gate structures includes forming gate structures all around respective channel structures.

Aspect (12) includes the method of Aspect (1), wherein the replacing the sacrificial gate layers with the gate structures includes forming at least one gate dielectric of the gate structures over uncovered portions of the channel structures. At least one work function metal (WFM) of the gate structures is formed over the at least one gate dielectric.

Aspect (13) includes the method of Aspect (12), wherein the forming the at least one gate dielectric of the gate structures includes selectively depositing the at least one dielectric on the uncovered portions of the channel structures.

Aspect (14) includes the method of Aspect (1), wherein the forming the initial stack of semiconductor layers includes forming a first layer of a first dielectric material on a surface of a first semiconductor material over the substrate. An initial opening is formed within the first layer. The initial opening uncovers the first semiconductor material. The sidewall structure is formed within the initial opening such that the first semiconductor material is uncovered by an inner opening through the sidewall structure. The sidewall structure includes a second dielectric material. The initial stack of semiconductor layers is formed within the inner opening.

Aspect (15) includes the method of Aspect (1), wherein the S/D regions are formed on the uncovered side surfaces of the channel structures by epitaxial growth.

Aspect (16) includes a semiconductor device. The semiconductor device includes a stack of transistors stacked over a substrate in a direction substantially perpendicular to a working surface of the substrate. Each transistor includes a respective channel structure, respective source/drain (S/D) regions positioned on ends of the respective channel structure, and a respective gate structure disposed all around the respective channel structure. Respective channel structures of at least two transistors include different chemical compositions.

Aspect (17) includes the semiconductor device of Aspect (16), wherein at least one transistor includes a plurality of channel structures. Respective S/D regions of the at least one transistor are configured to electrically connect to the plurality of channel structures.

Aspect (18) includes the semiconductor device of Aspect (16), wherein at least one transistor includes a plurality of channel structures. A respective gate structure of the at least one transistor is disposed all around the plurality of channel structures.

Aspect (19) includes the semiconductor device of Aspect (16), further including inner spacers disposed between the gate structures and respective S/D regions.

Aspect (20) includes the semiconductor device of Aspect (19), wherein at least one gate structure includes a work function metal (WFM) and a gate dielectric. The WFM is separated from an adjacent respective S/D region, in a direction substantially parallel to the working surface of the substrate, by a respective inner spacer alone or by the respective inner spacer and the gate dielectric.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

FIG. 4A' shows a top view of the semiconductor device in FIG. 4A, in accordance with one embodiment of the present disclosure.

FIG. 4B' shows a top view of the semiconductor device in FIG. 4B, in accordance with one embodiment of the present disclosure.

FIG. 4D' shows a top view of the semiconductor device in FIG. 4D, in accordance with one embodiment of the present disclosure.

FIG. 4F' shows a top view of the semiconductor device in FIG. 4F, in accordance with one embodiment of the present disclosure.

FIG. 4F" shows a vertical cross-sectional view taken along the line cut KK' in FIG. 4F', in accordance with one embodiment of the present disclosure.

FIG. 4G' shows a top view of the semiconductor device in FIG. 4G, in accordance with one embodiment of the present disclosure.

DETAILED DESCRIPTION

Figure 1A:
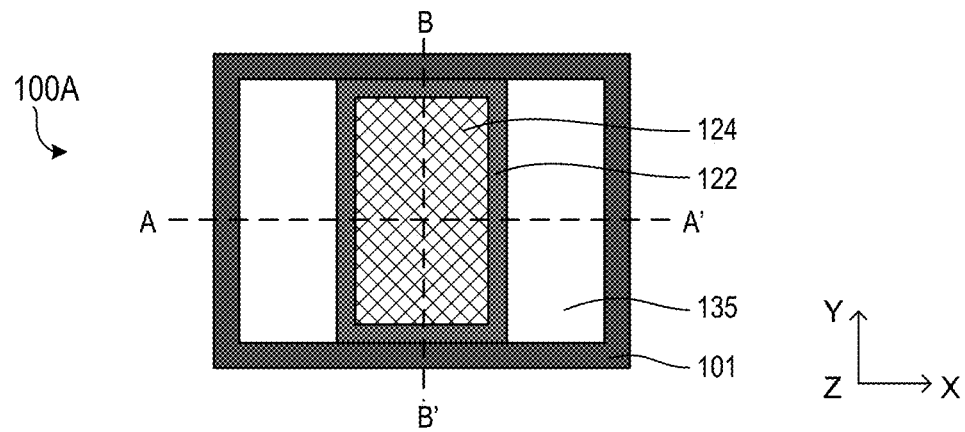
FIG. 1A shows a top view of a semiconductor device, in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Techniques herein provide methods and designs for self-aligned nanosheets that enable higher density circuits to be produced at reduced cost. Techniques include starting with isolation first, which is prior to nanosheet growth that provides for compact and efficient 3D nanosheet devices. This process eliminates a need for the dummy gate process, and also provides a 3D device with reduced process steps.

Techniques herein enable spacers to be placed adjacent to the channel to maximize the performance of the 3D transistors. In some embodiments, two sides of the top view have one dielectric that is selective to the perpendicular two sides. This feature enables both channel release and S/D formation to be achieved with reduced masking layers as well as being self-aligned. Examples in the illustrations show a N=4 nanosheet stack (i.e. a stack including 4 nanosheets) with the S/D regions combined for the stacked NMOS and PMOS regions, and side by side NMOS/PMOS flows. Note, however, that embodiments can be N tall with any device order. Embodiments also cover a single channel with one epitaxial S/D regions as a device.

Figure 1B:
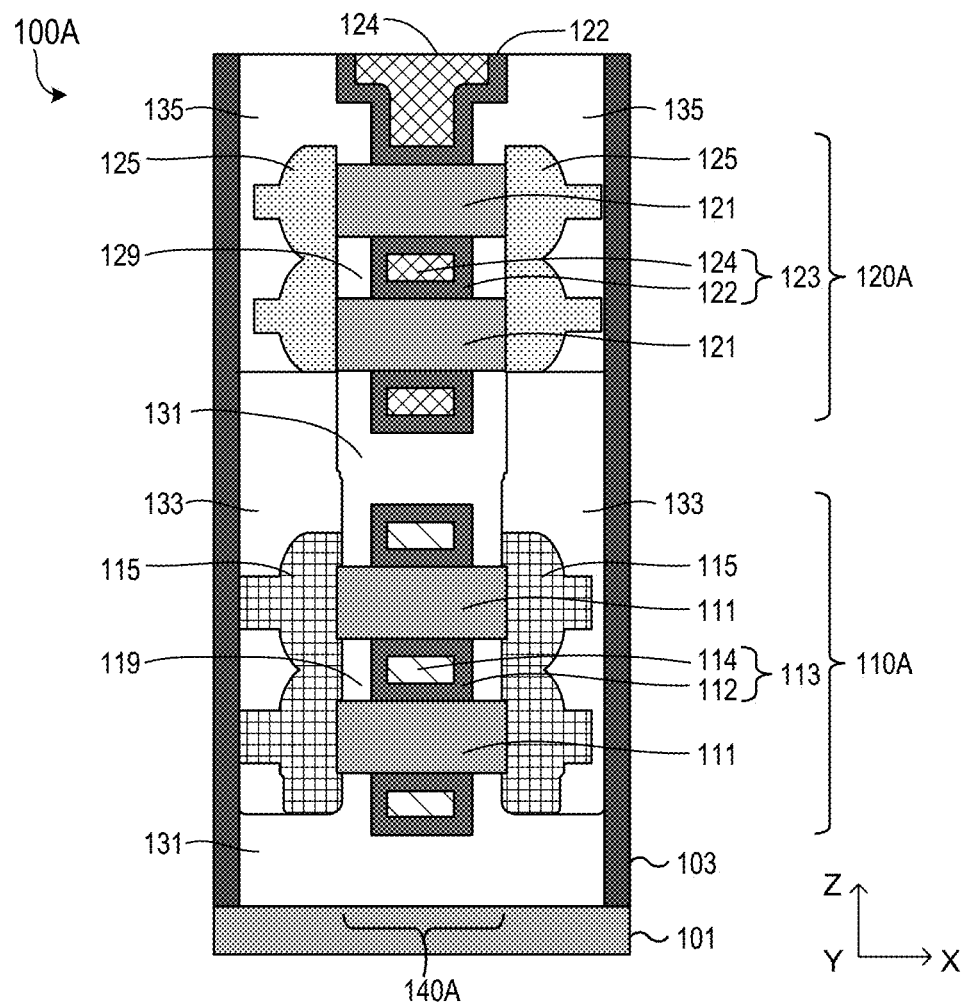
FIG. 1B shows a vertical cross-sectional view taken along the line cut AA' in FIG. 1A, in accordance with one embodiment of the present disclosure.
Figure 1C:
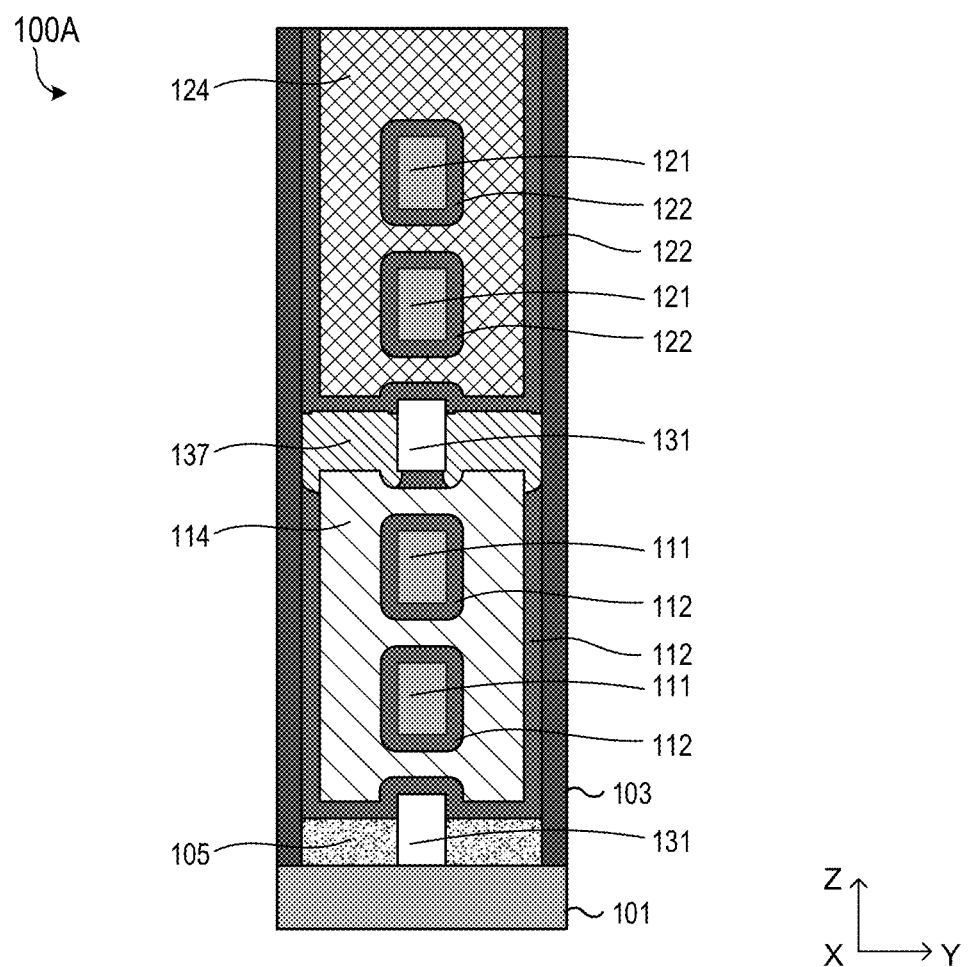
FIG. 1C shows a vertical cross-sectional view taken along the line cut BB' in FIG. 1A, in accordance with one embodiment of the present disclosure.

FIG. 1A shows a top view of a semiconductor device 100A, in accordance with one embodiment of the present disclosure. FIGS. 1B and 1C respectively show vertical cross-sectional views taken along the line cuts AA' and BB' in FIG. 1A, in accordance with some embodiments of the present disclosure.

The semiconductor device 100A includes at least one stack 140A of transistors (e.g. 110A and 120A) stacked over a substrate 101 in a direction (e.g. the Z direction) substantially perpendicular to a working surface of the substrate 101. Each transistor can include at least one respective channel structure (e.g. 111 and 121), respective source/drain (S/D) regions (e.g. 115 and 125) positioned on respective ends of the at least one respective channel structure, and at least one respective gate structure (e.g. 113 and 123) disposed all around the at least one respective channel structure.

In a non-limiting example, the semiconductor device 100A can include a first transistor 110A and a second transistor 120A. Specifically, the first transistor 110A includes one or more (e.g. two) first channel structures 111, first S/D regions 115 and at least one first gate structure 113 while the second transistor 120A includes one or more (e.g. two) second channel structures 121, second S/D regions 125 and at least one second gate structure 123. Since the first transistor 110A is similar to the second transistor 120A, consider the first transistor 110A for example. In the examples of FIGS. 1A-1C the first S/D regions 115 are in direct contact with both of the first channel structures 111 so that each of the first S/D regions 115 is configured to function as a common S/D region for the first transistor 110A. The first gate structure 113 can also be in direct contact with both of the first channel structures 111 and configured to function as a common gate structure. As a result, the first transistor 110A and the second transistor 120A each include a gate-all-around (GAA) multi-channel transistor. Of course it should be understood that the semiconductor device 100A can include any number of stacks 140A arranged in the XY plane over the substrate 101. The stack 140A can include any number of transistors arranged in the Z direction. Each transistor may include any number of channel structures arranged in the Z direction, while respective S/D regions and gate structures can be configured to electrically connect to any number of channel structures.

Note that the channel structures can include different chemical compositions from one another. That is, the channel structures can include different semiconductor materials, different dopants and/or different dopant concentration profiles. For instance, the first channel structures 111 may include a different chemical composition from the second channel structures 121. In one example, the first channel structures 111 include n-type silicon while the second channel structures 121 include p-type silicon. In another example, the first channel structures 111 include p-type silicon while the second channel structures 121 include n-type silicon. Additionally, the channel structures can have various shapes or geometry. For example, the channel structures can be nanosheets.

In some embodiments, the gate structures (e.g. 113 and 123) each include at least one work function metal (WFM) (e.g. 114 and 124) and at least one gate dielectric (e.g. 112 and 122). As can be appreciated, the WFMs 114 and 124 which function as the gate conductors may be different from each other, and the gate dielectrics 112 and 122 may also be different from each other, depending on respective channel structures (i.e. 111 and 121), design requirements (e.g. gate threshold voltage), etc. In this example, the WFM 114 is disposed all around the first channel structures 111 while the WFM 124 is disposed all around the second channel structures 121. Therefore, the first gate structure 113 and the second gate structure 123 can both be configured to function as common gate structures for multiple channel structures. In other examples (not shown), the first gate structures 113 and/or the second gate structures 123 may be disposed all around a single channel structure. While the WFM 114 and 124 are shown as a single material, they may each be made up of two or more layers of metals having different work functions. Similarly, the gate dielectric 112 and 122 may be made up of two or more layers of dielectric materials.

In the example of FIG. 1B, the first S/D regions 115 and the second S/D regions 125 are configured to electrically connect to a plurality of (e.g. two) channel structures. In alternative embodiments, the first S/D regions 115 and/or the second S/D regions 125 may be in direct contact with only one respective channel structure. Accordingly, the semiconductor device 100 can include one or more single-channel transistors.

Further, inner spacers (e.g. 119 and 129) can be disposed on ends of the gate structures (e.g. 113 and 123). The inner spacers (e.g. 119) are insulating and therefore can separate the gate structures (e.g. 113) from respective S/D regions (e.g. 115). Particularly in this example, the WFM 114 is separated from a respective first S/D region 115 by a respective inner spacer 119 and the gate dielectric 112 in a direction (e.g. the X direction) substantially parallel to the working surface of the substrate 101. In other words, a portion of the gate dielectric 112 forms part of a gate spacer that is disposed between the WFM 114 and the respective first S/D region 115 in the X direction to isolate the gate from the S/D region.

Additionally, the substrate 101 can include a semiconductor material. In some embodiments, the substrate 101 is positioned over an insulator disposed on a substrate (not shown). That is, an epitaxial layer of the semiconductor material is grown on a substrate having a dielectric layer disposed thereon. Thus, the stack 140A can be disposed over an SOI (silicon-on-insulator), a GeOI (Germanium-on-insulator), an SGOI (SiGe-on-insulator) or the like. In some embodiments, the substrate 101 can include completed devices with isolated silicon on top. In some embodiments, the substrate 101 includes single crystal silicon at a top surface of the substrate 101. The single crystal silicon can function as a seed layer for epitaxially growing a semiconductor layer thereon.

In some embodiments, the semiconductor device 100 can include dielectric materials, e.g. as shown by 103, 105, 112, 122, 131, 133, 135, 137, 119 and 129. The dielectric materials may also be referred to as isolation structures, isolation layers, diffusion breaks, inner spacers, gate dielectrics, etc. depending on functions thereof. For example, the dielectric material 133 can be used to separate the first S/D regions 115 from the second S/D regions 125 and thus be referred to as an isolation structure 133 or a diffusion break 133. Similarly, the dielectric material 137 can separate the first gate structure 113 from the second gate structure 123 and thus be referred to as vertical isolation structure 137. Additionally, some of the dielectric materials may include identical materials or may include different materials. For example, the dielectric material 131 and the inner spacers 119 and 129 may include a same material.

Figure 1D:
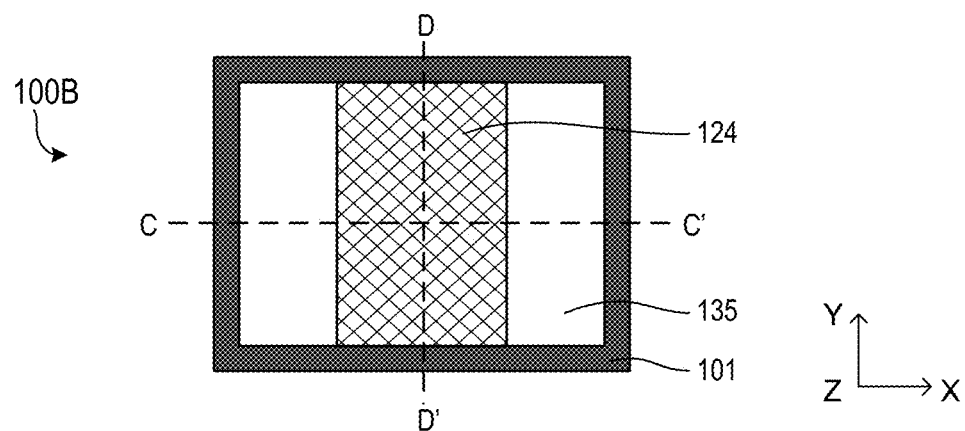
FIG. 1D shows a top view of a semiconductor device, in accordance with another embodiment of the present disclosure.
Figure 1E:
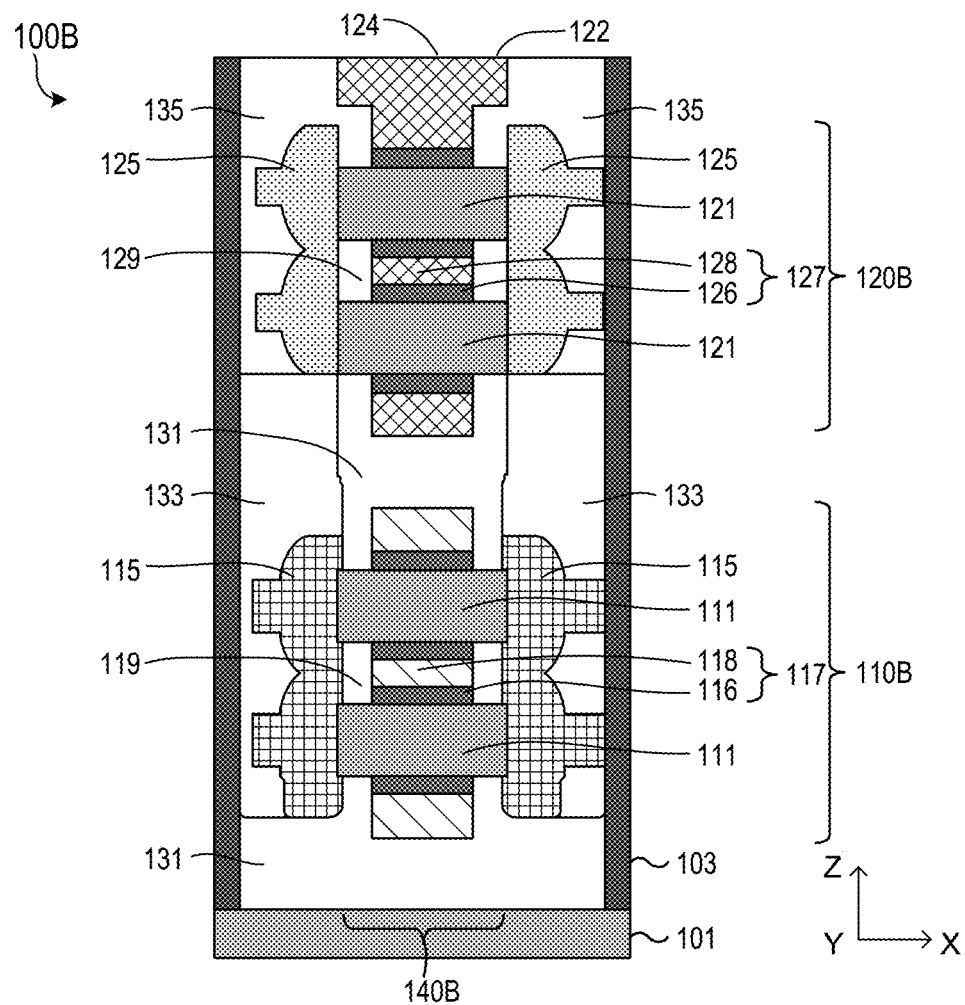
FIG. 1E shows a vertical cross-sectional view taken along the line cut CC' in FIG. 1C, in accordance with one embodiment of the present disclosure.
Figure 1F:
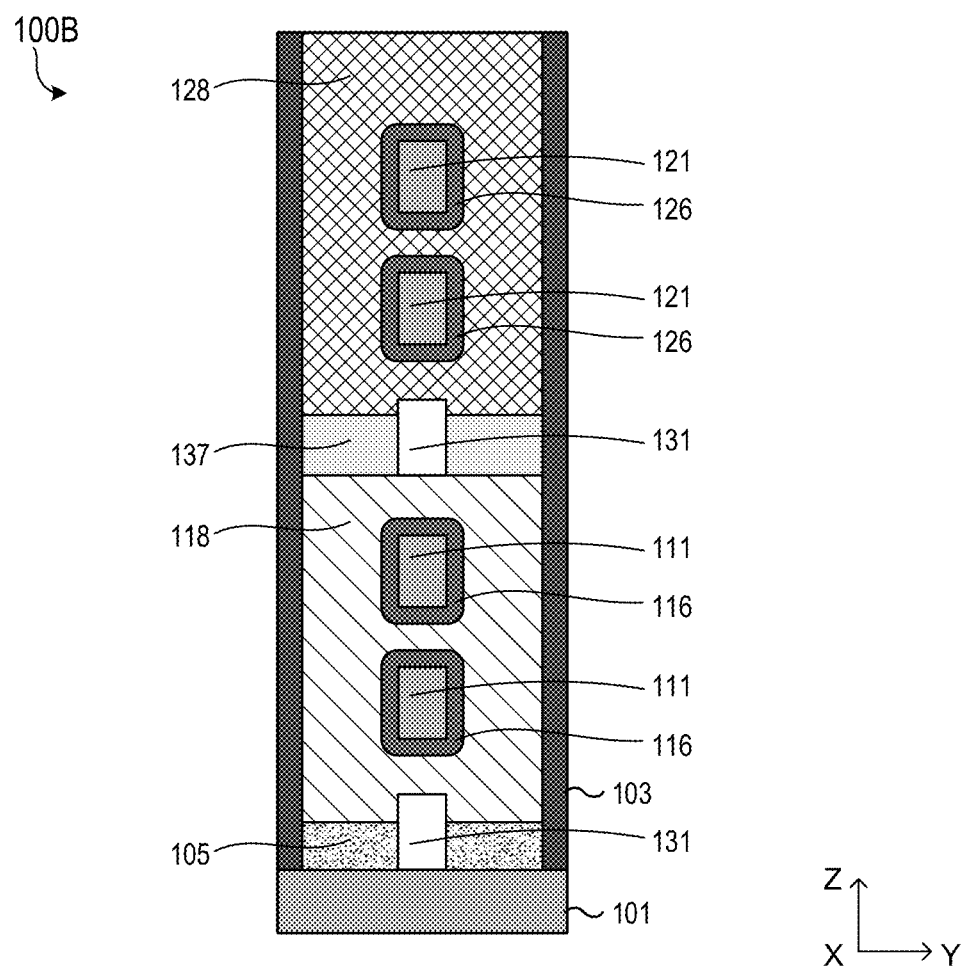
FIG. 1F shows a vertical cross-sectional view taken along the line cut DD' in FIG. 1C, in accordance with one embodiment of the present disclosure.

FIG. 1D shows a top view of a semiconductor device 100B, in accordance with another embodiment of the present disclosure. FIGS. 1E and 1F respectively show vertical cross-sectional views taken along the line cuts CC' and DD' in FIG. 1D, in accordance with some embodiments of the present disclosure. Since the embodiment of the semiconductor device 100B is similar to the embodiment of the semiconductor device 100A, descriptions herein will be provided with emphasis placed on difference. Note that similar or identical components are labeled with the same numerals, such as the substrate 101 in FIGS. 1A-1F.

As illustrated, the semiconductor device 100B can include a stack 140B having gate structures (e.g. 117 and 127), each of which includes at least one WFM (e.g. 118 and 128) and at least one gate dielectric (e.g. 116 and 126). Since first gate structures 117 and second gate structures 127 are similar to each other, consider the first gate structure 117 for example. In this embodiment, the first gate structure 117 is disposed all around the first channel structures 111 and can be configured to function as a common gate structure. In an alternative embodiment (not shown), the first gate structure 117 may be disposed all around a single channel structure. Note that different from the first gate structure 113 in FIGS. 1A-1C, the WFM 118 herein can be separated from a respective first S/D region 115 by a respective inner spacer 119 alone in the X direction. In other words, the WFM 118 is in direct contact with the inner spacers 119 in the X direction (without the gate dielectric 116 disposed in between). That is, in the embodiment of FIGS. 1D-1F, the gate spacer includes only the inner spacer 119, and does not include the gate dielectric material. In addition, the WFM 118 may be in direct contact with the dielectric materials 103, 105 and 131 (without the gate dielectric 116 disposed in between) as illustrated in FIG. 1F.

Note that the presence or absence of a respective gate dielectric to form part of the gate spacer between the WFM and a respective S/D region can be used to control the distance between the WFM and the respective S/D region, which may further be used to tune some electrical and/or chemical properties. In one example, junction resistance between the WFM and the respective S/D region is determined by the distance and materials in between. In a design limited by space, a relatively short distance (e.g. the semiconductor device 100B in FIGS. 1D-1F) may be preferred. In another example, a respective inner spacer (with or without the respective gate dielectric) can act as a barrier for preventing unwanted diffusion between the WFM and the respective S/D region.

Figure 2A:
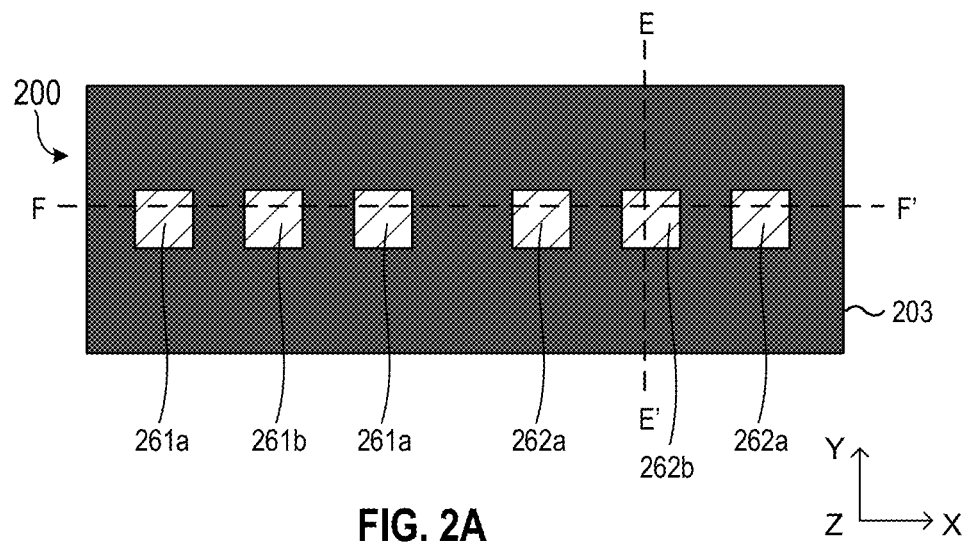
FIG. 2A shows a top view of a semiconductor device, in accordance with yet another embodiment of the present disclosure.
Figure 2B:
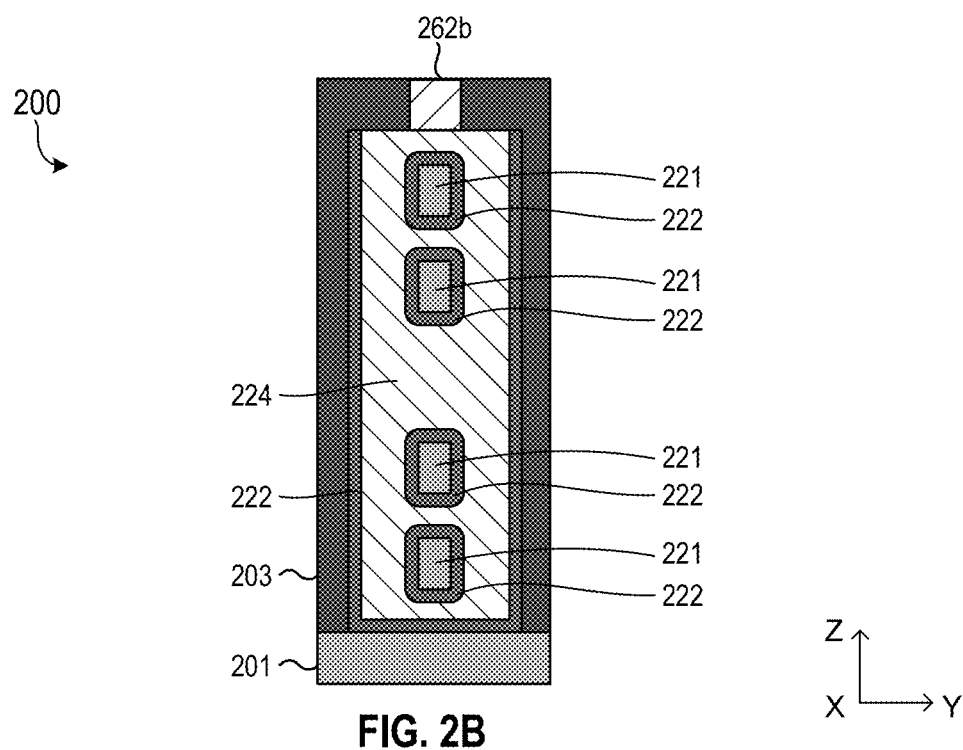
FIG. 2B shows a vertical cross-sectional view taken along the line cut EE' in FIG. 2A, in accordance with one embodiment of the present disclosure.
Figure 2C:
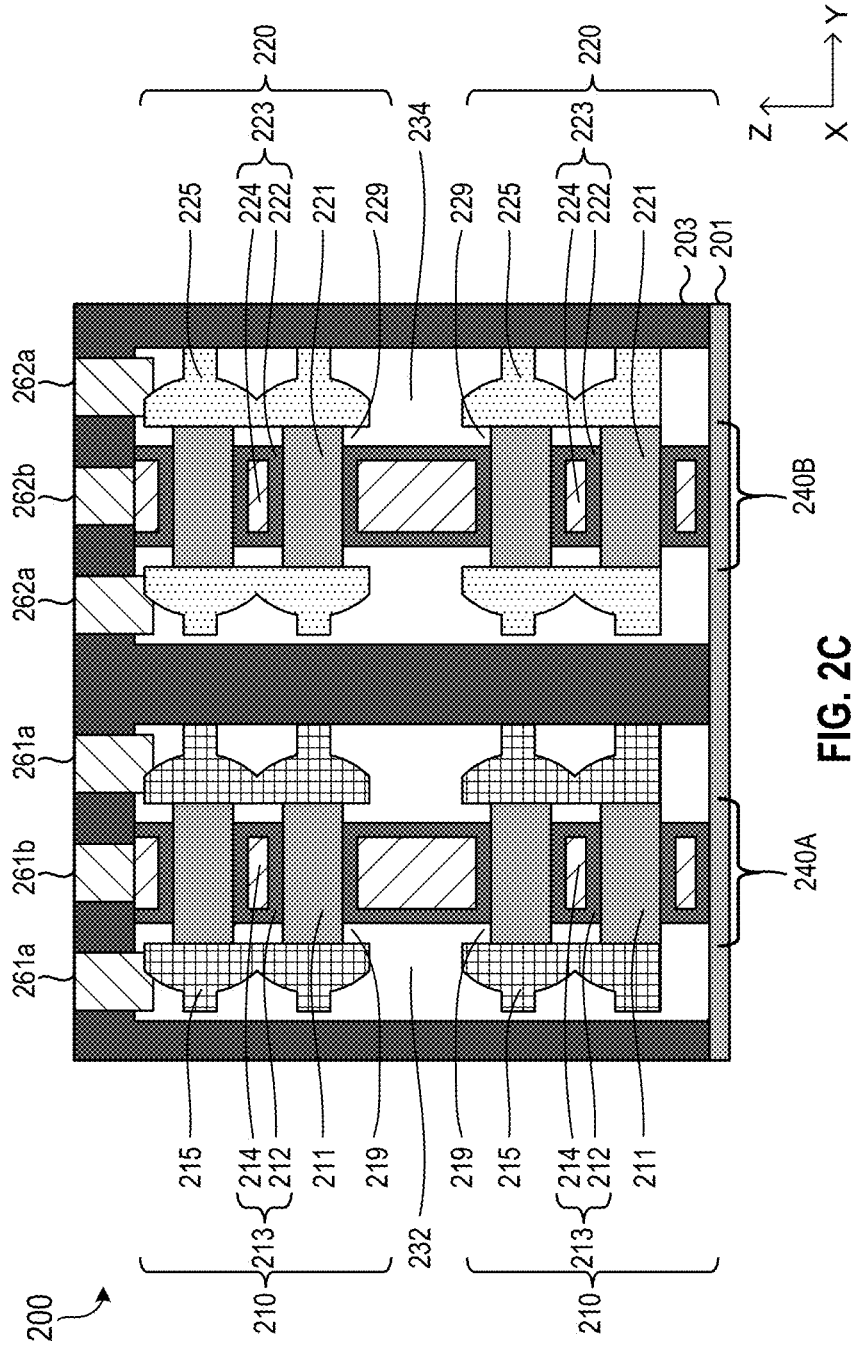
FIG. 2C shows a vertical cross-sectional view taken along the line cut FF' in FIG. 2A, in accordance with one embodiment of the present disclosure.

FIG. 2A shows a top view of a semiconductor device 200, in accordance with yet another embodiment of the present disclosure. FIGS. 2B and 2C respectively show vertical cross-sectional views taken along the line cuts EE' and FF' in FIG. 2A, in accordance with some embodiments of the present disclosure. Since the embodiment of the semiconductor device 200 is similar to the embodiment of the semiconductor device 100A, descriptions herein will be provided with emphasis places on difference.

Note that similar or identical components are labeled with similar numerals unless specified otherwise. Specifically, first transistors 210 can correspond to the first transistor 110A. Second transistors 220 can correspond to the second transistor 120A. Channel structures (e.g. 211 and 221) can correspond to the channel structures (e.g. 111 and 121). Gate structures (e.g. 213 and 223) can correspond to the gate structures (e.g. 113 and 123). WFMs (e.g. 214 and 224) can correspond to the WFMs (e.g. 114 and 124). Gate dielectrics (e.g. 212 and 222) can correspond to the gate dielectrics (e.g. 112 and 122). S/D regions (e.g. 215 and 225) can correspond to the S/D regions (e.g. 115 and 125). Inner spacers (e.g. 219 and 229) can correspond to the inner spacers (e.g. 119 and 129). A substrate 201 can correspond to the substrate 101. A dielectric material 203 can correspond to the dielectric material 103.

Herein, a first stack 240A includes first channel structures 211 and first gate structures 213 while a second stack 240B includes second channel structures 221 and second gate structures 223. Consider the first stack 240A for example. As illustrated, the first stack 240A may include two first transistors 210 arranged in the Z direction because the first channel structures 211 include a same chemical composition as each other. For example, the first transistors 210 can be n-type or p-type. As a result, the first transistors 210 can share a common gate structure 213. That is, the WFM 214 can be disposed all around the first channel structures 211 with the gate dielectric 212 disposed in between. In the embodiment of FIG. 2C, an isolation structure (e.g. 137 in FIG. 1C) is not used to divide (or separate) the gate structure of the upper transistor from the gate structure of the lower transistor. Therefore, the WFM in FIG. 2C serves as a common gate to the upper and lower transistors. Of course it should be understood that the first stack 240A can include any number of transistors, each of which may include any number of channel structures, arranged in the Z direction.

The second stack 240B is similar to the first stack 240A. However, second channel structures 221 may include a different chemical composition from the first channel structures 211. Accordingly, the second gate structures 223 may include a different chemical composition from the first gate structures 213, and second S/D regions 225 may include a different chemical composition from first S/D regions 215. As a result, second transistors 220 may be different from the first transistors 210. In one embodiment, the first transistors 210 are n-type while the second transistors 220 are p-type. In another embodiment, the first transistors 210 are p-type while the second transistors 220 are n-type. In yet another embodiment, the first transistors 210 and the second transistors 220 are both n-type or are both p-type, while the first channel structures 211 and the second channel structures 221 may include different dopants and/or different dopant concentration profiles. Further, it should be understood that the semiconductor device 200 can include any number of stacks (e.g. 210 and 220) arranged in the XY plane over the substrate 201.

Further, the semiconductor device 200 can include contact structures (e.g. 261*a*, 261*b*, 262*a* and 262*b*). Specifically, contact structures 261*a* and 262*a* are configured to electrically connect to the first S/D regions 215 and the second S/D regions 225 respectively. Contact structures 261*b* and 262*b* are configured to electrically connect to the first gate structures 213 and the second gate structures 223 respectively.

In addition, the semiconductor device 200 can include dielectric materials, e.g. as shown by 203, 212, 222, 232, 234, 219 and 229. The dielectric materials may also be referred to as isolation structures, isolation layers, diffusion breaks, inner spacers, gate dielectrics, etc. depending on functions thereof. The dielectric materials may or may include different materials. For example, the dielectric material 232 and the inner spacers 219 may include a same material. The dielectric material 234 and the inner spacers 229 may include a same material.

While not shown, in an alternative embodiment, the semiconductor device 200 can include gate structures similar to the first gate structures 117 and the second gate structures 127 as shown in FIGS. 1D-1F. That is, at least one WFM can be separated from a respective S/D region by a respective inner spacer alone in the X direction. In other words, the at least one WFM is in direct contact with the inner spacers in the X direction (with no gate dielectric disposed in between).

Figure 3:
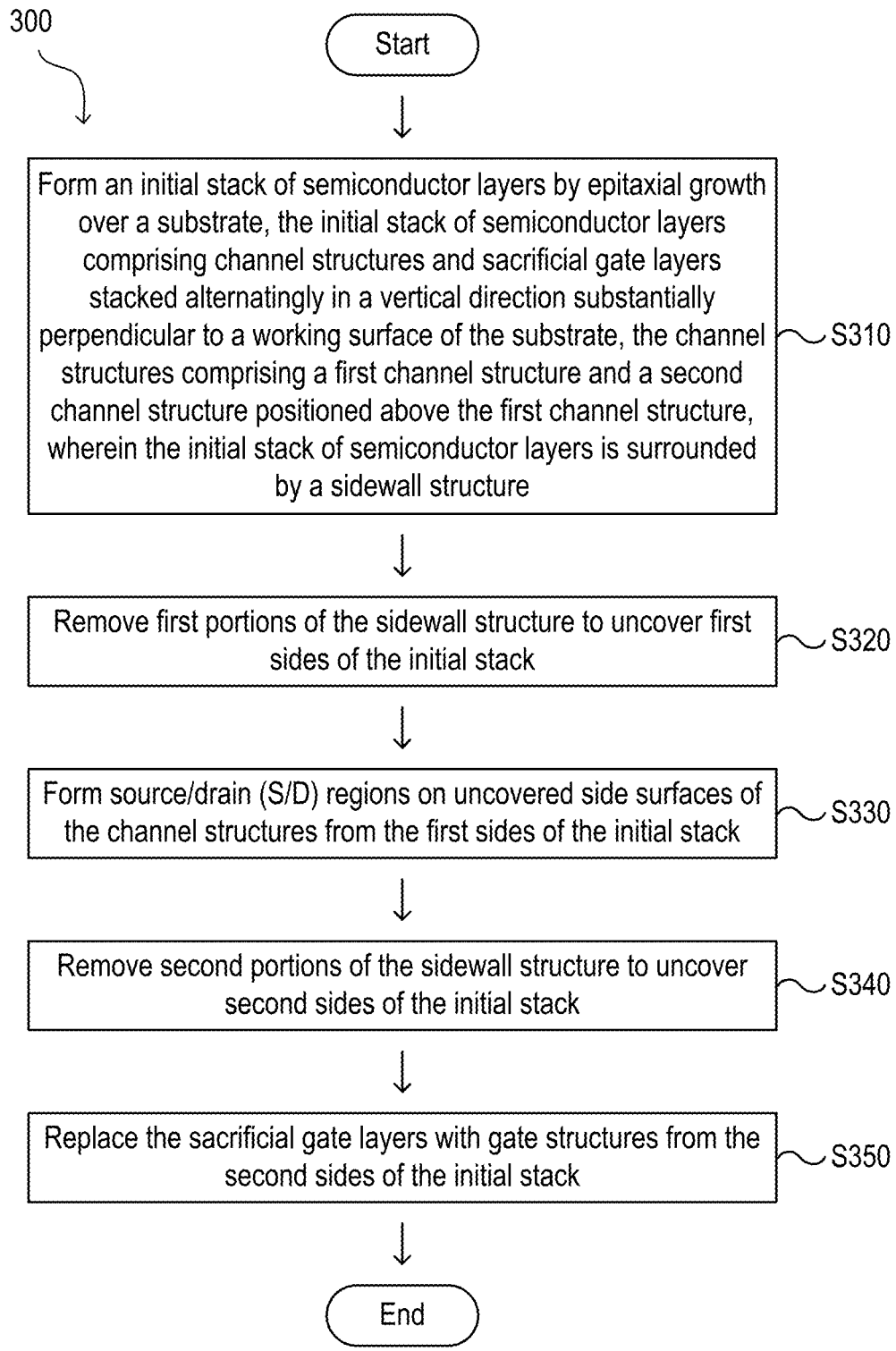
FIG. 3 shows a flow chart of a process for manufacturing a semiconductor device, in accordance with exemplary embodiments of the present disclosure.

FIG. 3 shows a flow chart of a process 300 for manufacturing a semiconductor device, such as the semiconductor device 100A, 100B, 200 or the like, in accordance with exemplary embodiments of the present disclosure. The process 300 starts with Step S310 where an initial stack of semiconductor layers is formed by epitaxial growth over a substrate. The initial stack of semiconductor layers is surrounded by a sidewall structure. The initial stack of semiconductor layers includes channel structures and sacrificial gate layers stacked alternatingly in a vertical direction substantially perpendicular to a working surface of the substrate. The channel structures include at least one first channel structure and at least one second channel structure positioned above the first channel structure.

In some embodiments, in order to form the initial stack of semiconductor layers, a first layer of a first dielectric material is formed on a surface of a first semiconductor material over the substrate. An initial opening is formed within the first layer. The initial opening uncovers the first semiconductor material. The sidewall structure is formed within the initial opening such that the first semiconductor material is uncovered by an inner opening through the sidewall structure. The sidewall structure includes a second dielectric material. The initial stack of semiconductor layers is formed within the inner opening.

The process 300 then proceeds to Step S320 by removing first portions of the sidewall structure to uncover first sides of the initial stack. For example, removal of the first portions can expose opposite end surfaces of a nanosheet from which the source and drain regions may be epitaxially grown.

At Step S330, source/drain (S/D) regions are formed, for example by epitaxial growth, on uncovered side surfaces of the channel structures from the first sides of the initial stack. In some embodiments, a protective structure is formed to cover respective side surfaces of the second channel structure from the first sides of the initial stack. First S/D regions of the S/D regions are formed on respective side surfaces of the first channel structure. The protective structure is removed. Second S/D regions of the S/D regions are formed on the respective side surfaces of the second channel structure.

At Step S340, second portions of the sidewall structure are removed to uncover second sides of the initial stack. For example, removal of the second portions can expose opposite side surfaces of a nanosheet around which a gate all around (GAA) structure will be formed.

At Step S350, the sacrificial gate layers are replaced with gate structures from the second sides of the initial stack. In some embodiments, the sacrificial gate layers include one or more first sacrificial gate layers in direct contact with the first channel structure and one or more second sacrificial gate layers in direct contact with the second channel structure. The replacing the sacrificial gate layers with the gate structures includes forming a protective structure to cover respective side surfaces of the one or more second sacrificial gate layers from the second sides of the initial stack. The one or more first sacrificial gate layers are replaced with one or more first gate structures. The protective structure is removed. The one or more second sacrificial gate layers are replaced with one or more second gate structures.

Several process flows will be described. According to some aspects of the present disclosure, a core flow starts with a semiconductor substrate, and then a uniform dielectric is deposited on the entire wafer surface. Openings are made to grow epitaxial nanosheets, some of which will also serve as a diffusion break between devices. Other selective dielectrics, spacers, innovations can also be integrated and shown to create a robust self-aligned 3D nanosheet device flow. There are various options and alternative embodiments. In one option (e.g. FIGS. 4A-4I), different channel structures (e.g. p-type and n-type epitaxial nanosheets) can be formed in a same stack or on a same vertical plain. A self-aligned scheme can thus be formed, and only a single lithography may be required to finish whole p-n nano-sheet fabrication. In another option (e.g. FIGS. 5A-5E), channel structures including a same chemical composition can be formed in a same stack or on a same vertical plain, allowing for another self-aligned scheme which needs only one lithography for each nanosheet device. In yet another option, at least one gate dielectric can be selectively deposited on a channel structure, for example selective high-k dielectric deposition on silicon (including the doped regions).

FIGS. 4A, 4B, 4C, 4D, 4E, 4F, 4G, 4H and 4I show vertical cross-sectional views of a semiconductor device 400 at various intermediate steps of a manufacturing process, such as the process 300, in accordance with some embodiments of the present disclosure. In some embodiments, FIGS. 4A, 4B, 4D and 4F respectively show vertical cross-sectional views (e.g. in the XZ plane) taken along the line cuts GG', HH', II' and Jr in FIGS. 4A', 4B', 4D' and 4F' while FIGS. 4F" and 4G respectively show vertical cross-sectional views (e.g. in the YZ plane) taken along the line cuts KK' and LL' in FIGS. 4F' and 4G'. In some embodiments, the semiconductor device 400 can eventually become the semiconductor device 100A, 100B or the like.

Figure 4A:
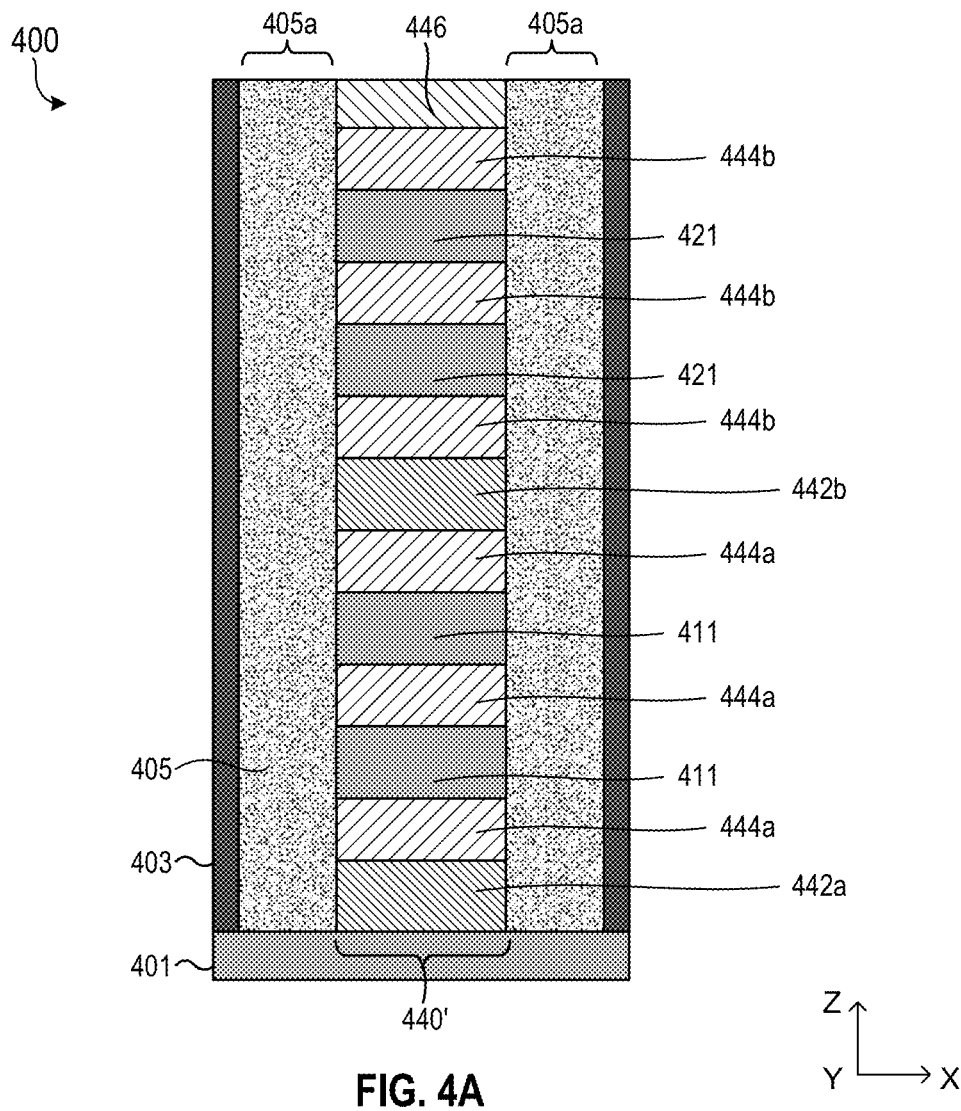
FIGS. 4A, 4B, 4C, 4D, 4E, 4F, 4G, 4H and 4I show vertical cross-sectional views of a semiconductor device at various intermediate steps of manufacturing, in accordance with some embodiments of the present disclosure.
Figure 4A:
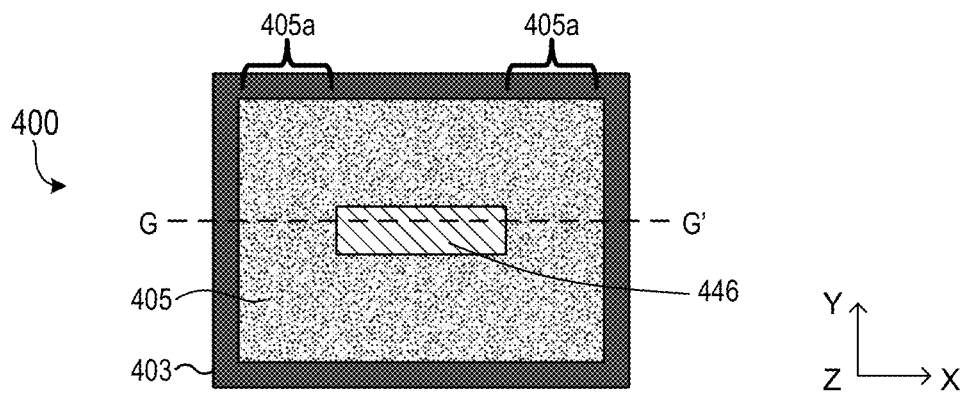

As shown in FIGS. 4A and 4A', the semiconductor device 400 includes a substrate 401 and an initial stack 440' of semiconductor layers (e.g. as shown by 411, 421, 442a, 442b, 444a and 444b) formed thereon. The initial stack 440' of semiconductor layers is surrounded by a sidewall structure 405, which can be further surrounded by a first dielectric material 403. The sidewall structure 405 can, for example, include a second dielectric material.

Specifically, the initial stack 440' of semiconductor layers can include channel structures (e.g. as shown by 411 and 421) and sacrificial gate layers 444 (e.g. as shown by 444a and 444b) stacked alternatingly in a vertical direction (e.g. the Z direction) substantially perpendicular to a working surface of the substrate 401. In a non-limiting example, the channel structures can include one or more (e.g. two) first channel structures 411 and one or more (e.g. two) second channel structures 421. Accordingly, the sacrificial gate layers 444 can include first sacrificial gate layers 444a, which are in direct contact with the first channel structures 411, and second sacrificial gate layers 444b which are in direct contact with the second channel structures 421. The initial stack 440' of semiconductor layers can further include sacrificial isolation layers 442 (e.g. as shown by 442a and 442b).

Note that the channel structures, the sacrificial gate layers 444 and the sacrificial isolation layers 442 can be configured to be etch selective to each other. In a non-limiting example, the channel structures include silicon (e.g. n-type Si, p-type Si or intrinsic Si). The sacrificial gate layers 444 include silicon germanium (noted as SiGe1) while the sacrificial isolation layers 442 include silicon germanium (noted as SiGe2). SiGe1 and SiGe2 can have different ratios of Si to Ge so as to have etch selectivity. For instance, SiGe1 can include 75 mol % of Si and 25 mol % of Ge, while SiGe2 can include 10 mol % of Si and 90 mol % of Ge.

In some embodiments, the first channel structures 411 can correspond to the first channel structures 111. The second channel structures 421 can correspond to the second channel structures 121. The first sacrificial gate layers 444a can be used to form a first gate structure, which corresponds to the first gate structure 113 or 117, as well as form inner spacers, which correspond to the inner spacers 119. The second sacrificial gate layers 444b can be used to form a second gate structure, which corresponds to the second gate structure 123 or 127, as well as form inner spacers, which correspond to the inner spacers 129. The sacrificial isolation layers 442 can be replaced with dielectric materials, which correspond to the dielectric materials 131, 133 and/or 137, to form isolation, for example between transistors (e.g. 442b) or between a transistor and the substrate 401 (e.g. 442a). Additionally, the substrate 401 can correspond to the substrate 101. The first dielectric material 403 can correspond to the dielectric material 103.

As a result, the initial stack 440' can eventually become the stack 140A, 140B or the like. Accordingly, it should be understood that any number of the initial stacks 440' can be formed over the substrate 401. Each initial stack 440' of semiconductor layers can include any number of first channel structures 411 and second channel structures 421. Each initial stack 440' of semiconductor layers can include any number of sacrificial isolation layers 442 (for forming future isolation between transistors).

In some embodiments, in order to form the semiconductor device 400 shown in FIGS. 4A and 4A', firstly, a first layer of the first dielectric material 403 can be formed on the substrate 401 which includes a surface of a first semiconductor material. Secondly, an initial opening (not shown) can be formed within the first layer (for example by patterning with a trench rectangular mask), and the initial opening uncovers the first semiconductor material, or rather the substrate 401. Thirdly, the sidewall structure 405 of the second dielectric material is formed within the initial opening such that the first semiconductor material is uncovered by an inner opening (not shown) through the sidewall structure 405. For example, the second dielectric material can be deposited by ALD to fill the opening before directionally etched (for example similar to a spacer open etch) to form the inner opening within the second dielectric material while a remaining portion of the second dielectric material forms the sidewall structure 405. Fourthly, the initial stack 440' of semiconductor layers can be formed within the inner opening, for example by epitaxial growth over the surface of the first semiconductor material. Further, a capping layer 446 may optionally be formed over the initial stack 440'.

"Epitaxial growth", "epitaxial deposition", "epitaxially grown", "epitaxially formed" or "epitaxy" as used herein generally refers to a type of crystal growth or material deposition in which a crystalline layer is formed over a seed layer that is crystalline. Crystalline characteristics (e.g. crystal orientation) of the crystalline layer are related to or dictated by crystalline characteristics of the seed layer. Particularly, a semiconductor material can be epitaxially grown on a surface of another semiconductor layer that is crystalline. In some embodiments, epitaxial growth can be selective such that a semiconductor material may only be epitaxially grown on another semiconductor surface and generally do not deposit on exposed surfaces of non-semiconductor materials, such as silicon oxide, silicon nitride, and the like. Epitaxial growth can be accomplished by molecular beam epitaxy, vapor-phase epitaxy, liquid-phase epitaxy, or the like. Si, SiGe, Ge and other semiconductor materials can be doped during epitaxial growth (in situ) by addition of dopants. For example in vapor-phase epitaxy, a dopant vapor can be added to the gas source.

Figure 4B:
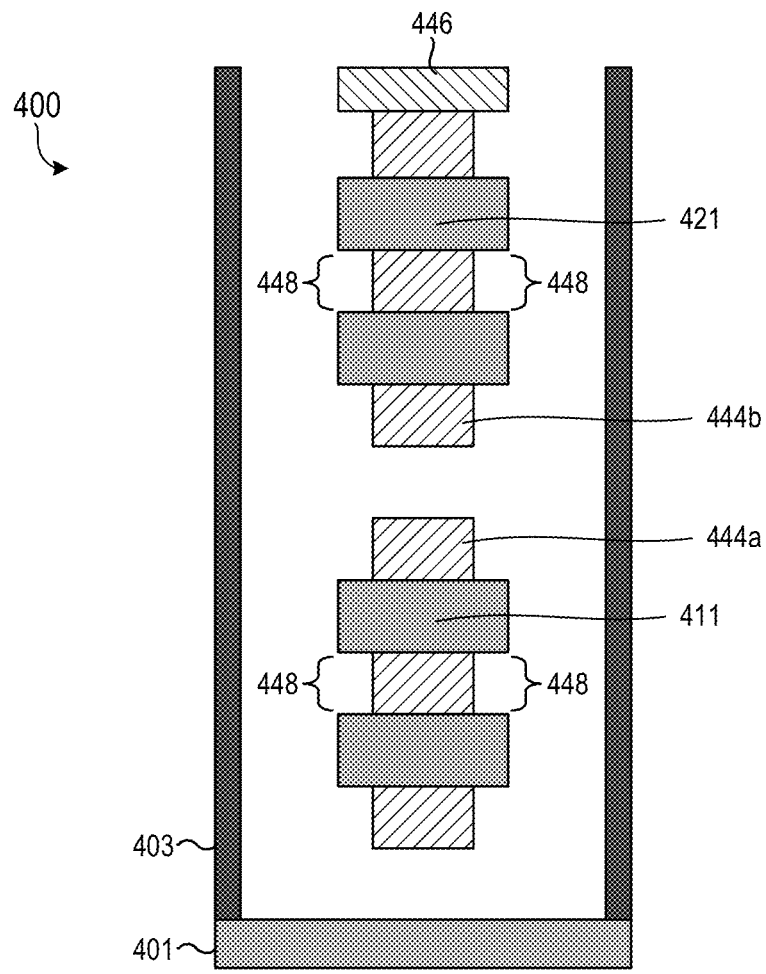
Figure 4B:
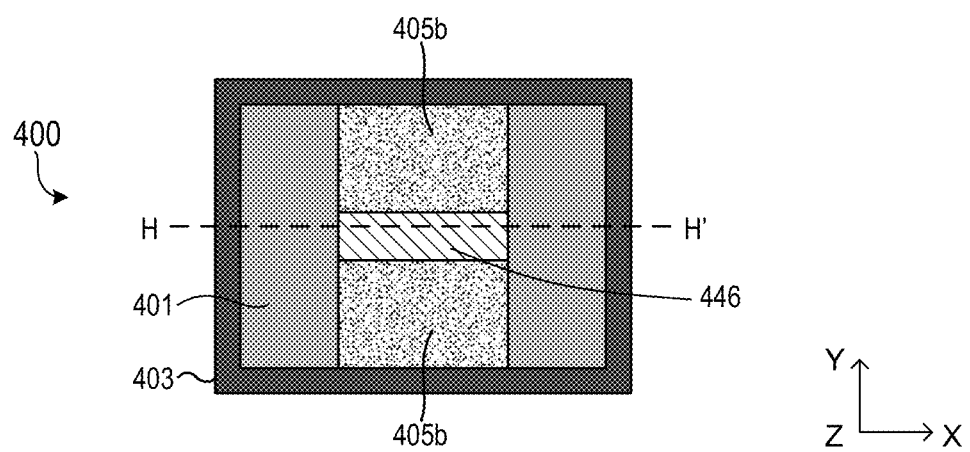

In FIGS. 4B and 4B', first portions 405a of the sidewall structure 405 are removed to uncover one or more first sides (e.g. the −X and +X sides) of the initial stack 440'. A mask is used to remove only the first portions 405a, while preserving the second portions 405b. Then, indentations 448 are formed by removing end portions of the sacrificial gate layers 444 from the first sides of the initial stack 440'. In the embodiment described, the sacrificial isolation layers 442 are also removed from the first sides of the initial stack 440'.

Specifically, different etch rates of the sacrificial gate layers 444 and the sacrificial isolation layers 442 permits the same etch process step to form indentations 448 while completely removing the sacrificial isolation layers 442.

Figure 4C:
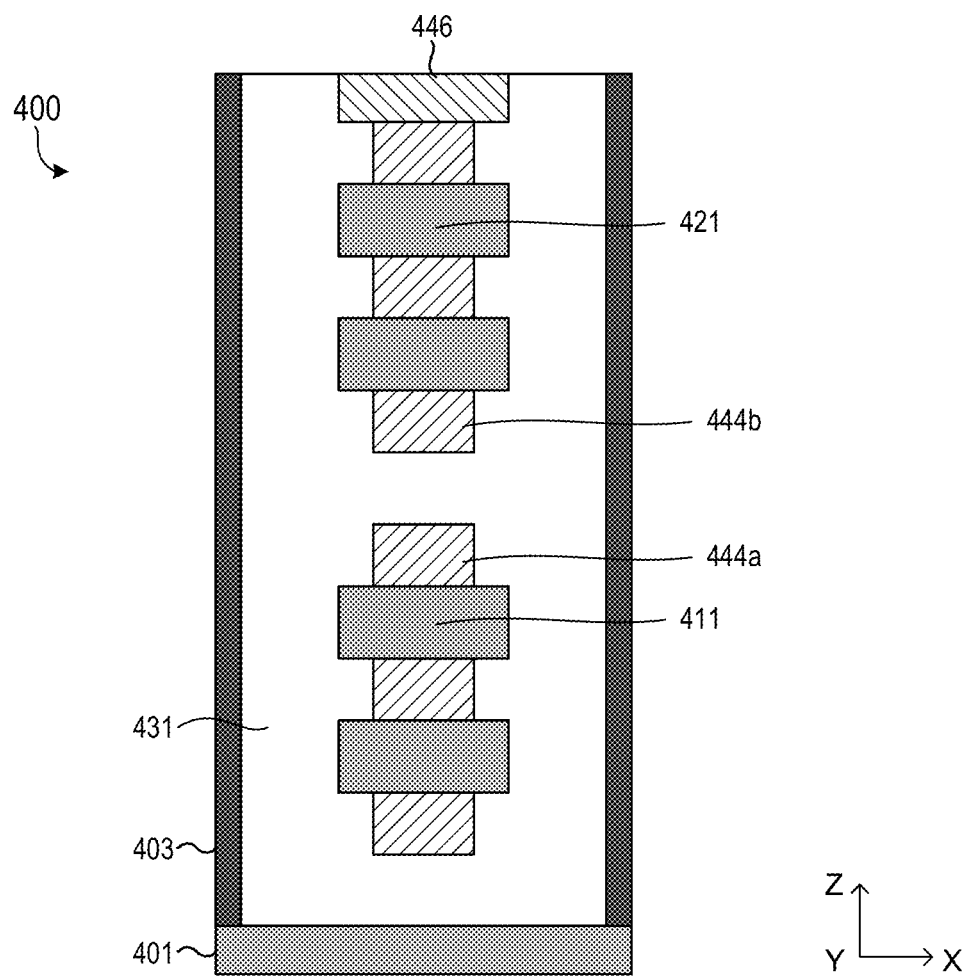

In FIG. 4C, a first filler material 431 (or a third dielectric material 431) is deposited and optionally planarized, for example by chemical mechanical polishing (CMP), to cover the first sides of the initial stack 440'. In some embodiments, the third dielectric material 431 can eventually become the dielectric material 131.

Figure 4D:
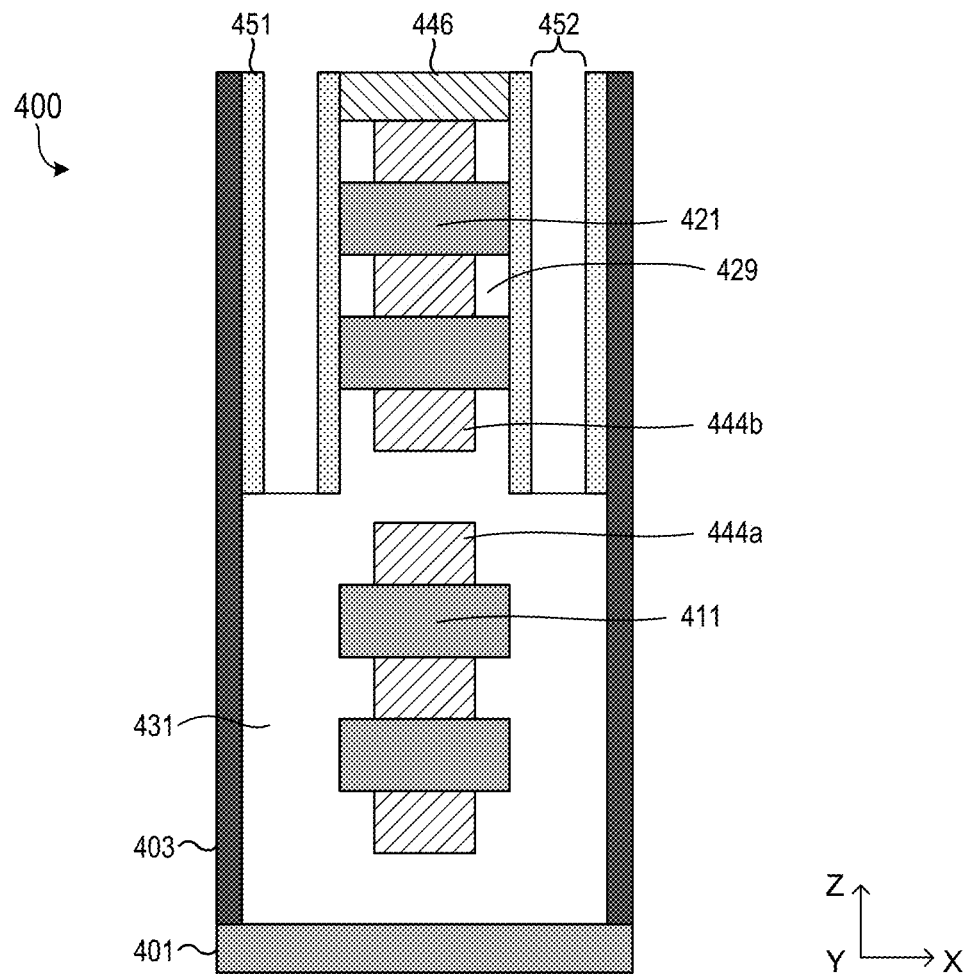
Figure 4D:
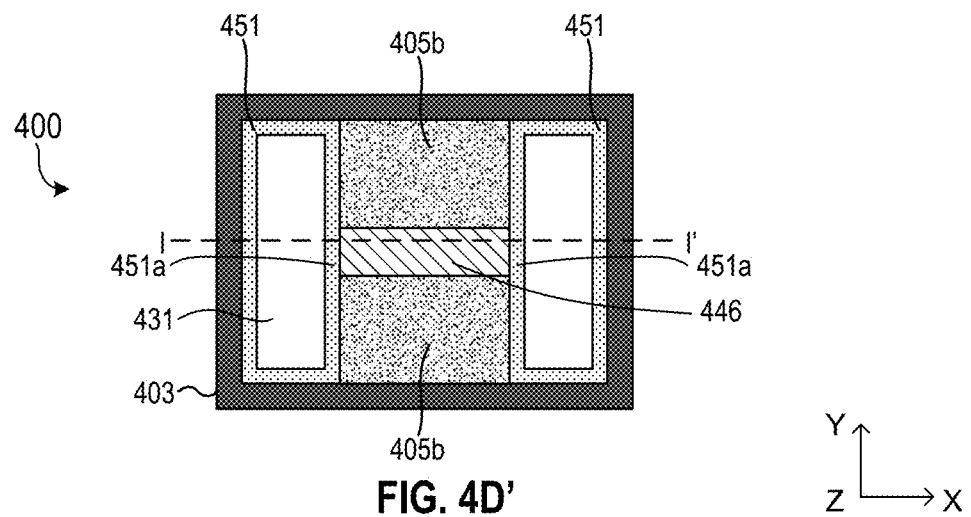

In FIGS. 4D and 4D', a first protective structure 451 is formed to cover side surfaces of the second channel structures 421 from the first sides of the initial stack 440'. Specifically, the first filler material 431 can be etched back to uncover the side surfaces of the second channel structures 421 while still leaving side surfaces of the first channel structures 411 covered. Subsequently, a second filler material (e.g. as partially shown by 451), which is etch selective to the first filler material 431, can be formed (for example by atomic layer deposition) over the first filler material 431 to cover the side surfaces of the second channel structures 421 (and optionally planarized). Next, the second filler material can be directionally etched to partially uncover the first filler material 431, for example by forming an opening 452, such that a remaining portion of the second filler material forms the first protective structure 451.

Note that inner spacers 429, which can correspond to the inner spacers 129, are formed as a result of etching back the first filler material 431. Further, the first protective structure 451 has a shape of a hollow rectangle in the top view in the FIG. 4D' example. It should be understood that the first protective structure 451 can have any suitable shape as long as the first protective structure 451 includes a portion 451a that covers the first sides of the initial stack 440'.

Figure 4E:
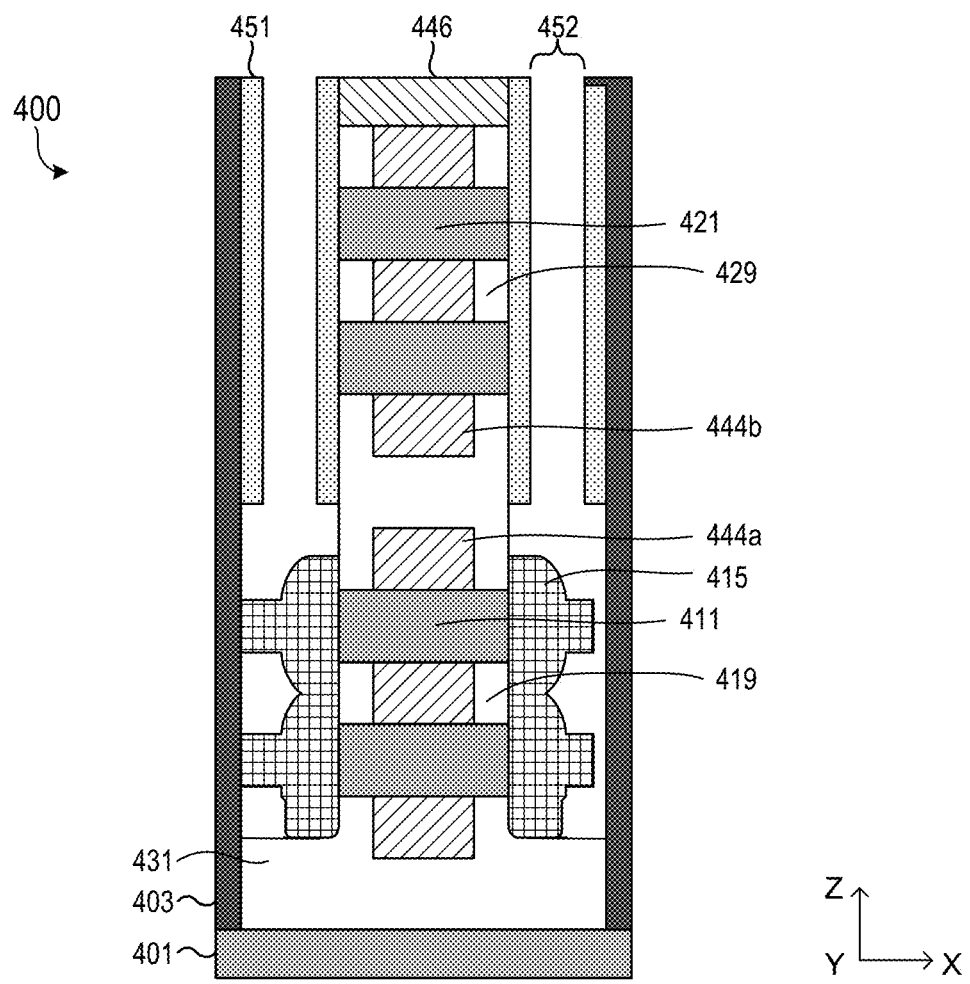

In FIG. 4E, the first filler material 431 is further etched back by selectively etching through the opening 452, which may for example include a first directional etching process and a second isotropic etching process. Consequently, inner spacers 419, which can correspond to the inner spacers 119, are formed. Moreover, the side surfaces of the first channel structures 411 are uncovered so that first S/D regions 415 (e.g. p-type silicon) can be formed thereon, for example by epitaxial growth (e.g. selectively from the side surfaces of the first channel structures 411). The first S/D regions 415 can correspond to the first S/D regions 115. Note that a remaining portion of the first filler material 431 can function to maintain isolation of the first S/D regions 415 from the substrate 401.

Figure 4F:
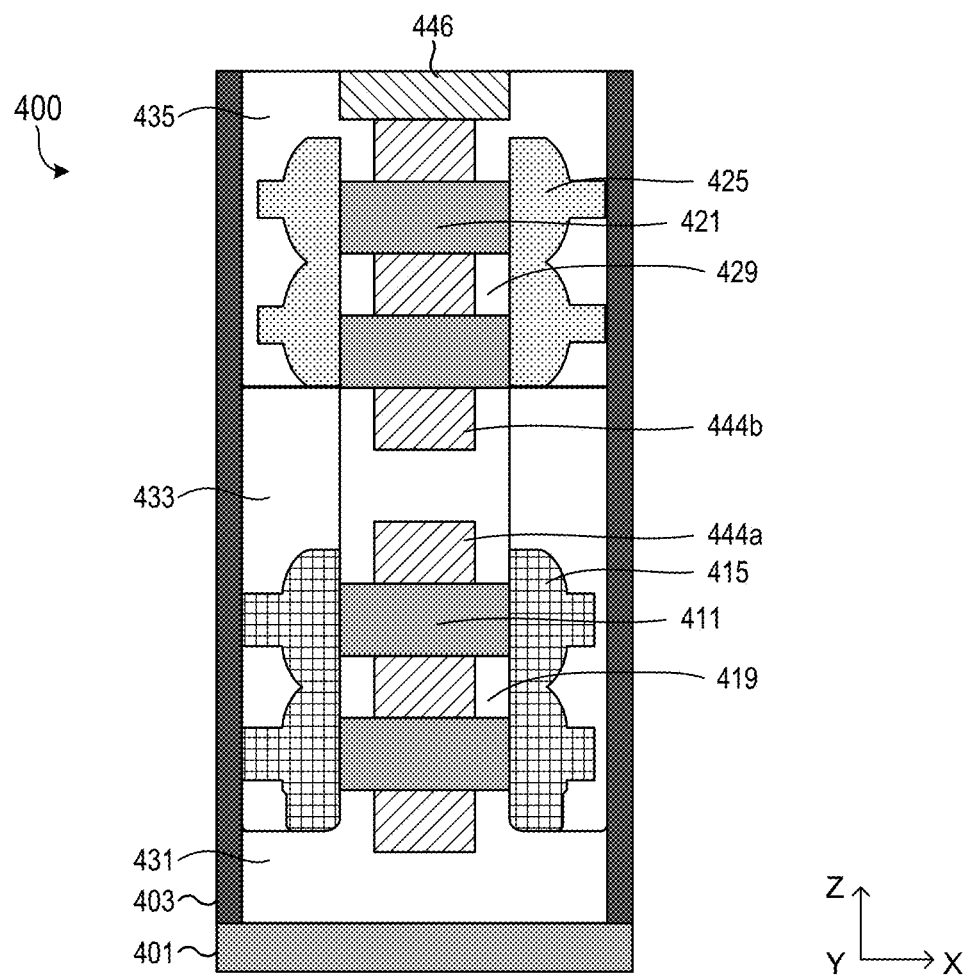
Figure 4F:
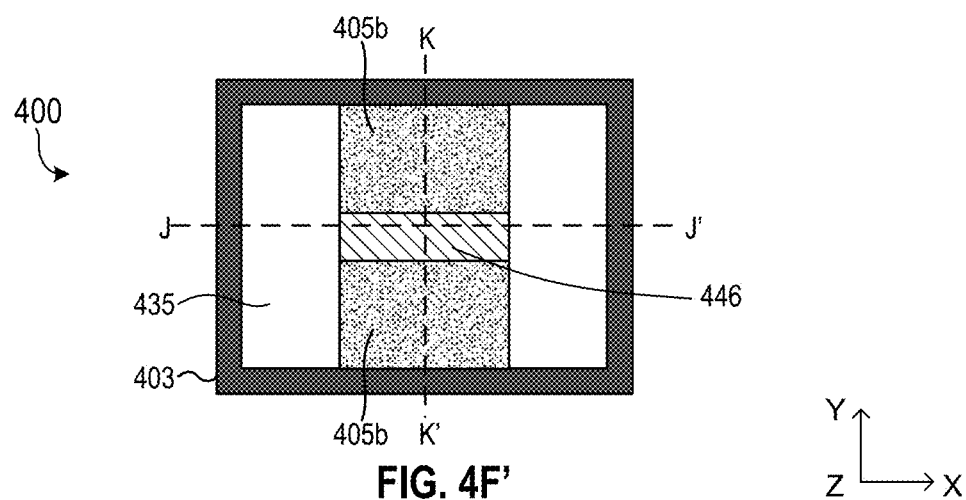
Figure 4F:
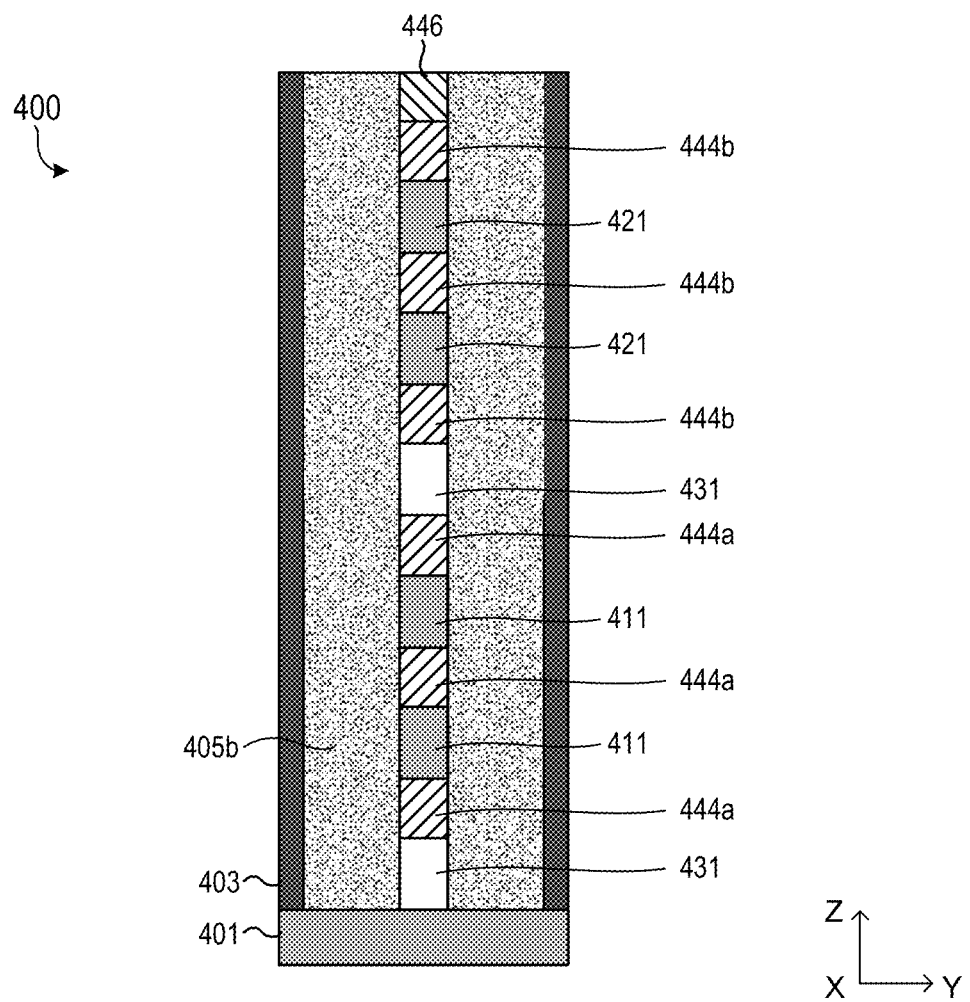

In FIGS. 4F, 4F' and 4F'', the first protective structure 451 is removed to uncover the side surfaces of the second channel structures 421 from the first sides of the initial stack 440' so that second S/D regions 425 (e.g. n-type silicon) can be formed thereon, for example by epitaxial growth (e.g. selectively from the side surfaces of the second channel structures 421). Dielectric materials 433 and 435 can also be deposited (and optionally planarized). The second S/D regions 425 can correspond to the second S/D regions 125. The dielectric materials 433 and 435 can correspond to the dielectric materials 133 and 135 respectively. Note that the vertical cross-sectional view (e.g. in the YZ plane) in FIG. 4F'' is perpendicular to the vertical cross-sectional view (e.g. in the XZ plane) in FIG. 4F.

Figure 4G:
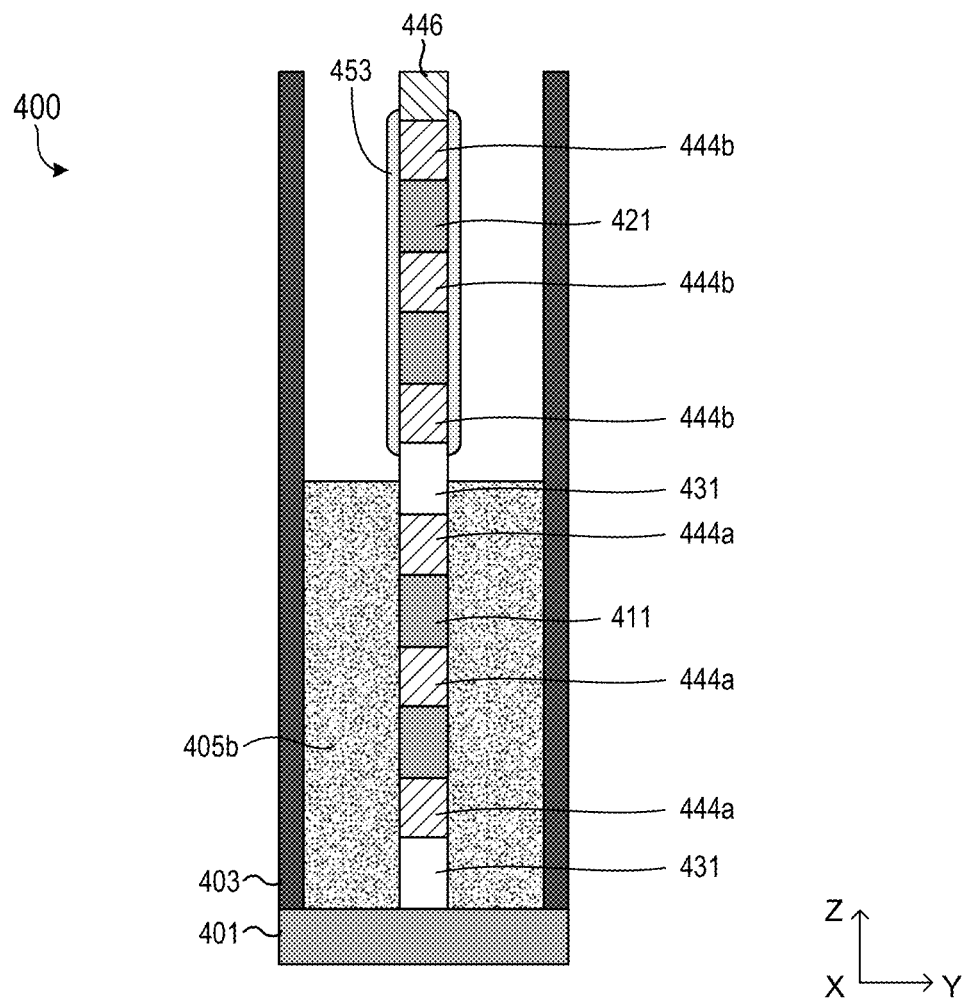
Figure 4G:
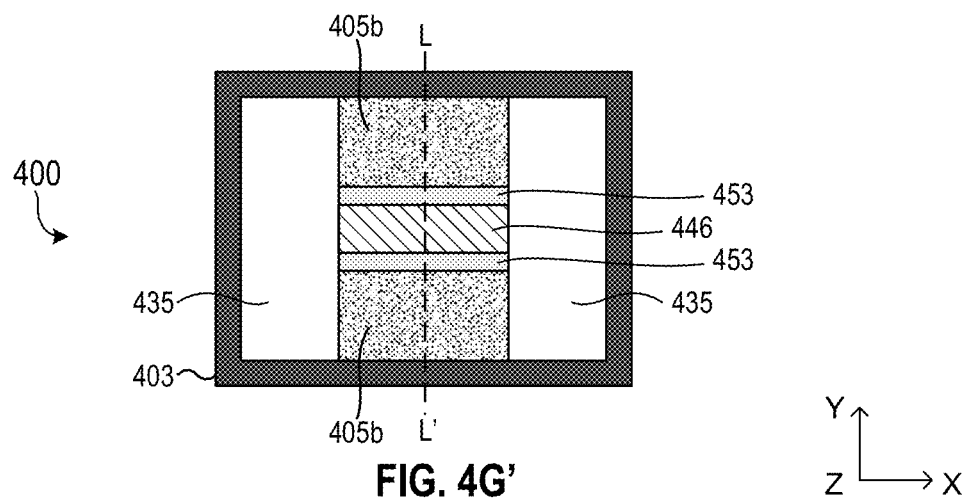

In FIGS. 4G and 4G', second portions 405b of the sidewall structure 405 are etched back (for example to a separation point at the first filler material 431) to uncover side surfaces of the second channel structures 421 from one or more second sides (e.g. the −Y and +Y sides) of the initial stack 440'. A second protective structure 453 can then be formed to cover the side surfaces of the second channel structures 421 and the second sacrificial gate layers 444b, while leaving the second portions 405b of the sidewall structure 405 at least partially uncovered.

Figure 4H:
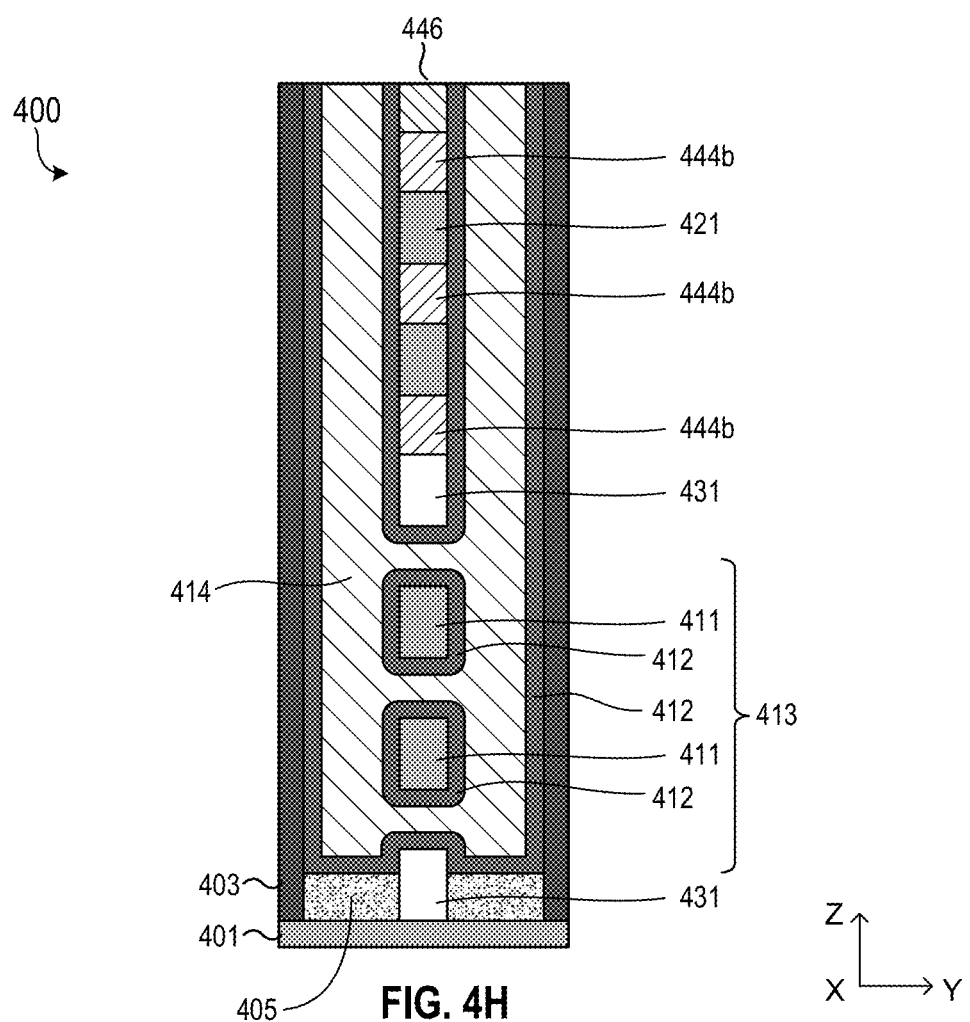
Figure 4I:
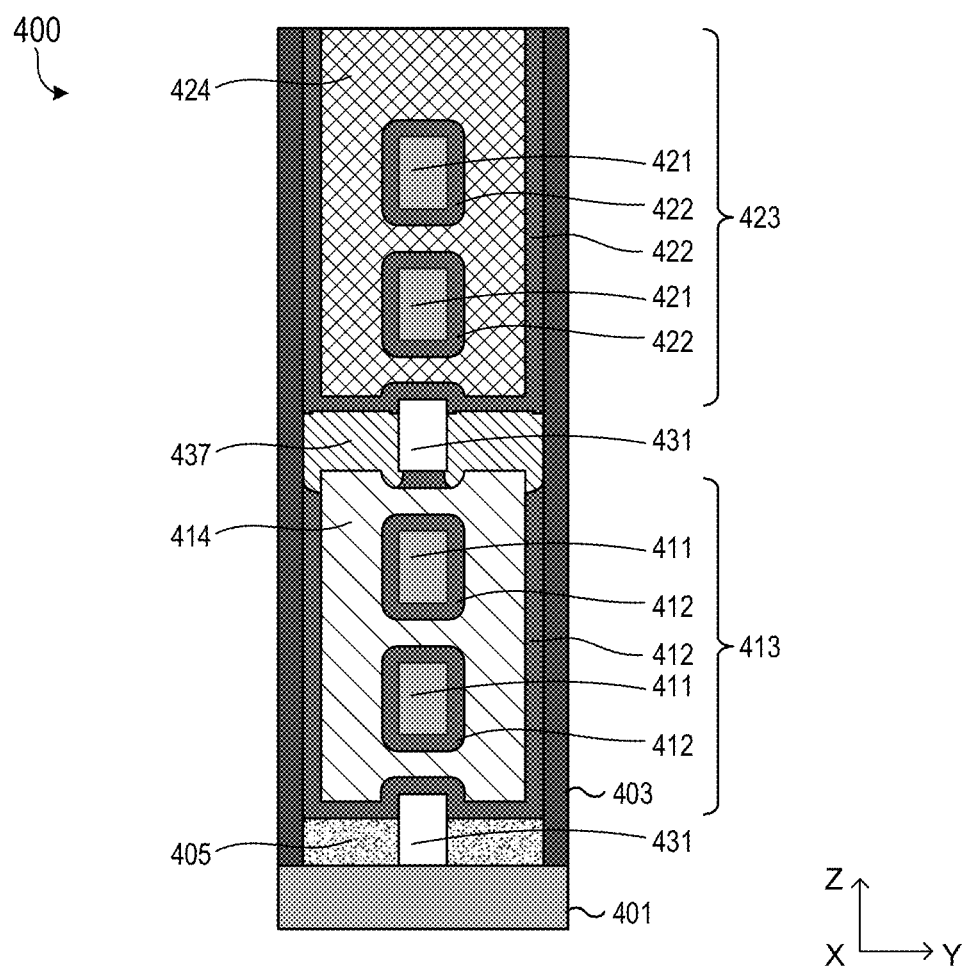

In FIG. 4H, the second portions 405b of the sidewall structure 405 are further etched back to uncover side surfaces of the first sacrificial gate layers 444a from the second sides of the initial stack 440' so that the first sacrificial gate layers 444a can be replaced with gate structures. In one embodiment, the first sacrificial gate layers 444a are removed (for example by selective etching) after the second portions 405b of the sidewall structure 405 are further etched back. Then, the second protective structure 453 is optionally removed. Next, at least one gate dielectric 412 can be formed on uncovered surfaces, e.g. uncovered surfaces of the first channel structures 411, the second channel structures 421, the second sacrificial gate layers 444b, the first dielectric material 403, etc. The at least one gate dielectric 412 can be formed by atomic layer deposition (ALD) for example. Subsequently, at least one WFM 414 is formed on the at least one gate dielectric 412 and optionally planarized by CMP. In another embodiment, the second protective structure 453 may be removed later, for example in a same etching process that etches back the gate dielectric 412 and the WFM 414 (e.g. as shown in FIG. 4I). Note that the at least one WFM 414 can eventually become the (at least one) WFM 114. The at least one gate dielectric 412 can eventually become the (at least one) gate dielectric 112.

In FIG. 4I, the gate dielectric 412 and the WFM 414 is etched back to uncover the side surfaces of the second channel structures 421 so that the second sacrificial gate layers 444b are uncovered and can be replaced with one or more second gate structures 423 (e.g. as shown by at least one gate dielectric 422 and at least one WFM 424). As a result, one or more first gate structures 413 are also formed (e.g. as shown by the at least one gate dielectric 412 and the at least one WFM 414). The at least one gate dielectric 422 can be formed by ALD for example while the at least one WFM 424 can be deposited and optionally planarized by CMP. An isolation structure 437 can be formed to separate the WFM 414 from the gate dielectric 422 and the WFM 424.

Herein, the one or more first gate structures 413 can correspond to the first gate structure 113. The one or more second gate structures 423 can correspond to the second gate structure 123. The at least one WFM 424 can correspond to the (at least one) WFM 124. The at least one gate dielectric 422 can correspond to the at least one gate dielectric 122. The isolation structure 437 can correspond to the isolation structure 137. Moreover, the semiconductor device 400 in FIG. 4I can correspond to the semiconductor device 100A in FIGS. 1A-1C. That is, the semiconductor device of FIG. 4I provides a stack of two transistors having gates vertically isolated from one another, with each transistor having a gate spacer that includes inner spacer and gate dielectric material.

Referring back to FIG. 4H, the gate dielectric 412 can be formed non-selectively on uncovered surfaces, e.g. the uncovered surfaces of the first channel structures 411, the second channel structures 421, the second sacrificial gate layers 444b, the first dielectric material 403, etc. In an alternative embodiment, the gate dielectric 412 can be selectively formed on the uncovered surfaces of the first channel structures 411 (and optionally the second channel structures 421 as well) by selective deposition. Similarly, in an alternative embodiment of FIG. 4I, the gate dielectric 422 can be selectively formed on the uncovered surfaces of the second channel structures 421. As a result, the semiconductor device 400 can become the semiconductor device 100B in FIGS. 1D-1F. That is, with selective deposition of the gate dielectric, the gate spacer includes only the inner spacer material.

FIGS. 5A, 5B, 5C, 5D and 5E show vertical cross-sectional views of a semiconductor device 500 at various intermediate steps of a manufacturing process, such as the process 300, in accordance with some embodiments of the present disclosure. In some embodiments, the semiconductor device 500 can eventually become the semiconductor device 200 or the like.

Figure 5A:
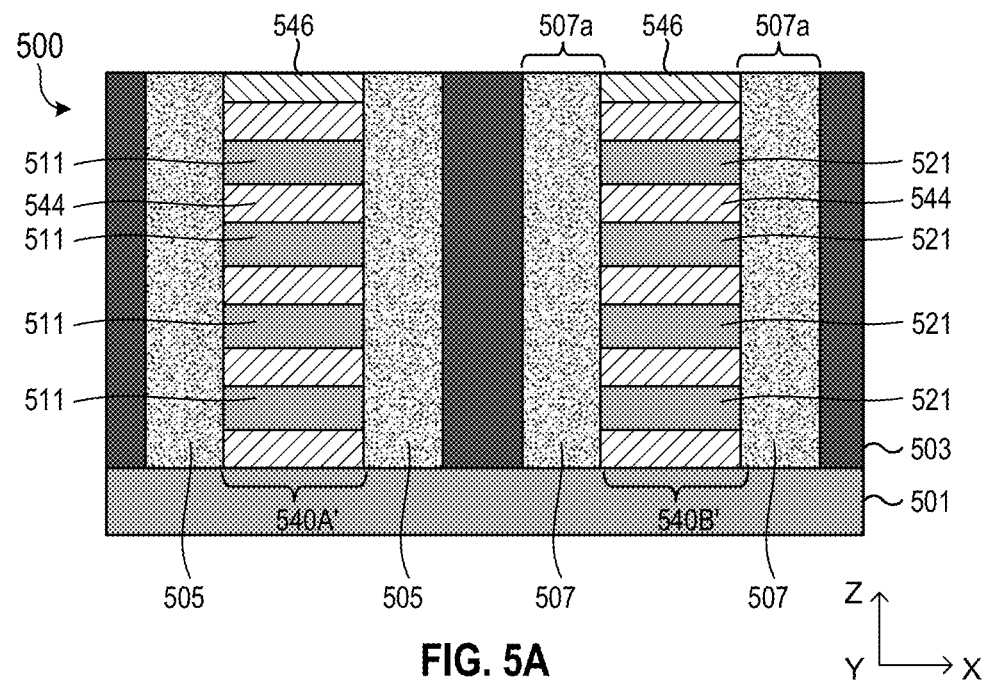
FIGS. 5A, 5B, 5C, 5D and 5E show vertical cross-sectional views of a semiconductor device at various intermediate steps of manufacturing, in accordance with some embodiments of the present disclosure.

As shown in FIG. 5A, the semiconductor device 500 includes a substrate 501 and initial stacks of semiconductor layers formed thereon, such as a first initial stack 540A' of semiconductor layers (e.g. as shown by 511 and 544) and a second initial stack 540B' of semiconductor layers (e.g. as shown by 521 and 544). The first initial stack 540A' of semiconductor layers and the second initial stack 540B' of semiconductor layers are surrounded by sidewall structures 505 and 507 respectively. The sidewall structures 505 and 507 can be further surrounded by a first dielectric material 503. The sidewall structures 505 and 507 can, for example, both include a second dielectric material (or include different dielectric materials from each other).

Specifically, the first initial stack 540A' of semiconductor layers can include first channel structures 511 and sacrificial gate layers 544 stacked alternatingly in a vertical direction (e.g. the Z direction) substantially perpendicular to a working surface of the substrate 501. The first channel structures 511 and the sacrificial gate layers 544 are configured to be etch selective to each other. Similarly, the second initial stack 540B' of semiconductor layers can include second channel structures 521 and sacrificial gate layers 544 stacked alternatingly in the Z direction. The second channel structures 521 and the sacrificial gate layers 544 are also configured to be etch selective to each other. For example, the first channel structures 511 and the second channel structures 521 can include silicon while the sacrificial gate layers 544 include silicon germanium (noted as SiGe3).

In some embodiments, the first channel structures 511 can correspond to the first channel structures 211. The second channel structures 521 can correspond to the second channel structures 221. The sacrificial gate layers 544 can be used to form gate structures, which correspond to the first gate structures 213 and/or the second gate structures 223, as well as form inner spacers, which correspond to the inner spacers 219 and/or 229. As a result, the first initial stack 540A' can eventually become the first stack 510. The second initial stack 540B' can eventually become the second stack 520. Accordingly, it should be understood that the semiconductor device 500 can include any number of first initial stacks 540A', second initial stacks 540B' or the like over the substrate 501. Each initial stack of semiconductor layers can include any number of channel structures. Additionally, the substrate 501 can correspond to the substrate 201. The first dielectric material 503 can correspond to the dielectric material 203. The sidewall structures 505 and 507 can both correspond to the sidewall structure 405.

In some embodiments, the semiconductor device 500 in FIG. 5A can be formed in a process similar to what has been described for the semiconductor device 400 in FIGS. 4A and 4A', for example including forming a first layer of the first dielectric material 503, forming initial openings, forming the sidewall structures 505 and 507 and forming the initial stacks. In one example, the sidewall structures 505 and 507 are formed in a same deposition and etching process so that the sidewall structures 505 and 507 include a same material. In another example, the sidewall structures 505 and 507 are formed in separate processes and may therefore include different materials. In one embodiment, the first initial stack 540A' and the second initial stack 540B' are formed simultaneously or concurrently. Accordingly, each of the first channel structures 511 includes a same chemical composition and a same thickness as a respective second channel structure 521. In another embodiment, the first initial stack 540A' and the second initial stack 540B' are formed in separate processes. Consequently, the first channel structures 511 and the second channel structures 521 may include different chemical compositions and/or different thicknesses.

Figure 5B:
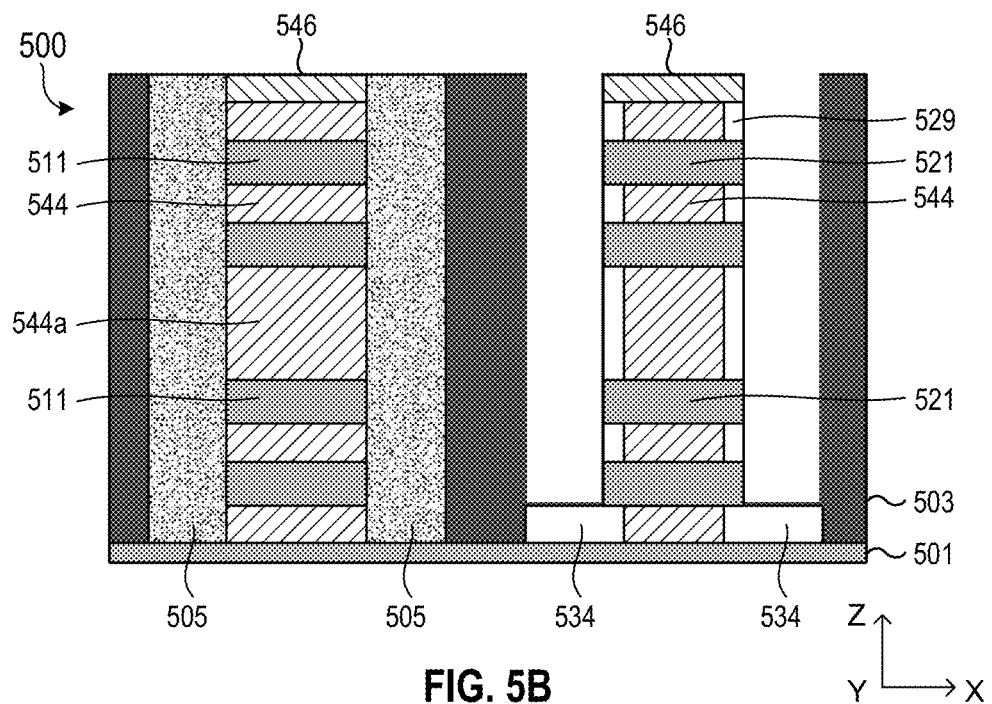

In FIG. 5B, inner spacers 529, which can correspond to the inner spacers 229, are formed on ends of the sacrificial gate layers 544 in the second initial stack 540B'. Moreover, the second channel structures 521 are uncovered from the −X and +X sides while a filler material 534 (or a third dielectric material 534) can function to isolate future structures (e.g. S/D regions) from the substrate 501.

Firstly, similar to FIGS. 4B and 4B', first portions 507a of the sidewall structure 507 can be directionally etched to uncover one or more first sides (e.g. the −X and +X sides) of the second initial stack 540B' before end portions of the sacrificial gate layers 544 in the second initial stack 540B' are removed to form indentations. Secondly, similar to FIG. 4C, the filler material 534 can be deposited (and optionally planarized) to cover the first sides of the second initial stack 540B'. The filler material 534 also fills space of the (empty) indentations. Thirdly, the filler material 534 can be directionally etched back. The filler material 534 which remains in the indentations forms the inner spacers 529. Accordingly, the filler material 534 and the inner spacers 529 can include a same dielectric material. Note the filler material 534 can correspond to the dielectric material 234.

Figure 5C:
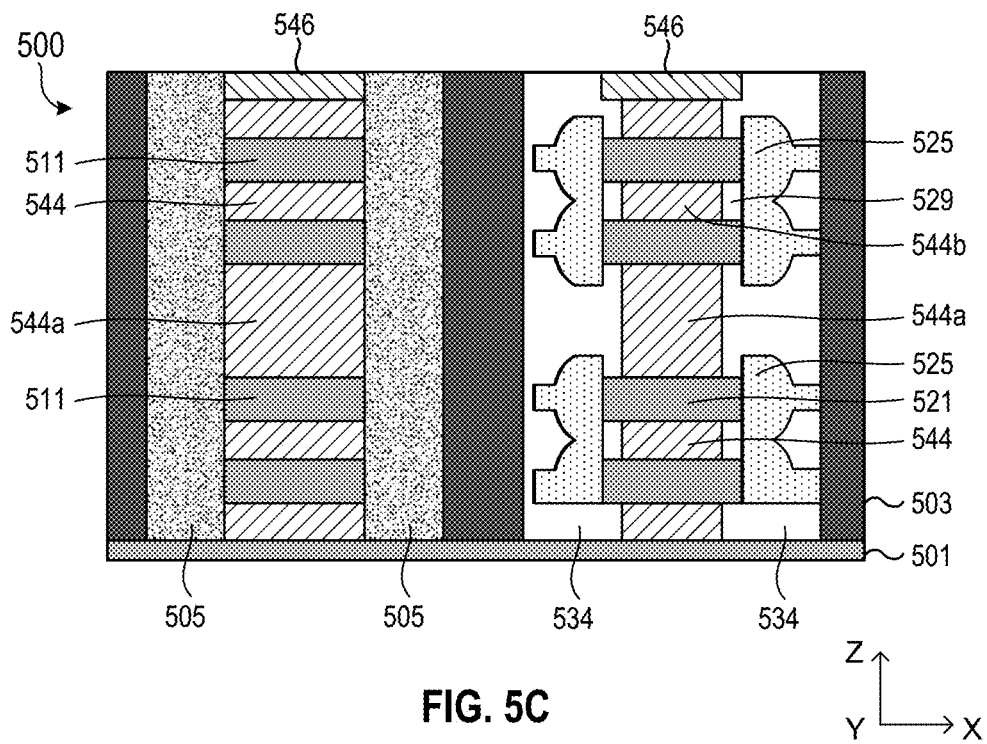

In FIG. 5C, second S/D regions 525 (e.g. n-type silicon), which can correspond to the second S/D regions 225, are formed on ends of the second channel structures 521 from the first sides of the second initial stack 540B', for example by epitaxial growth (e.g. selectively from the ends of the second channel structures 521). In this example, the second S/D regions 525 are each in direct contact with two channel structures. In another example, the second S/D regions 525 can each be in direct contact with any number of channel structures. A thickness of a sacrificial gate layer 544a can be configured to separate the second S/D regions 525 from each other in the Z directions. Similarly, a thickness of another sacrificial gate layer (e.g. 544b) can also be configured to separate (or divide) the second S/D regions 525 in the Z directions.

Figure 5D:
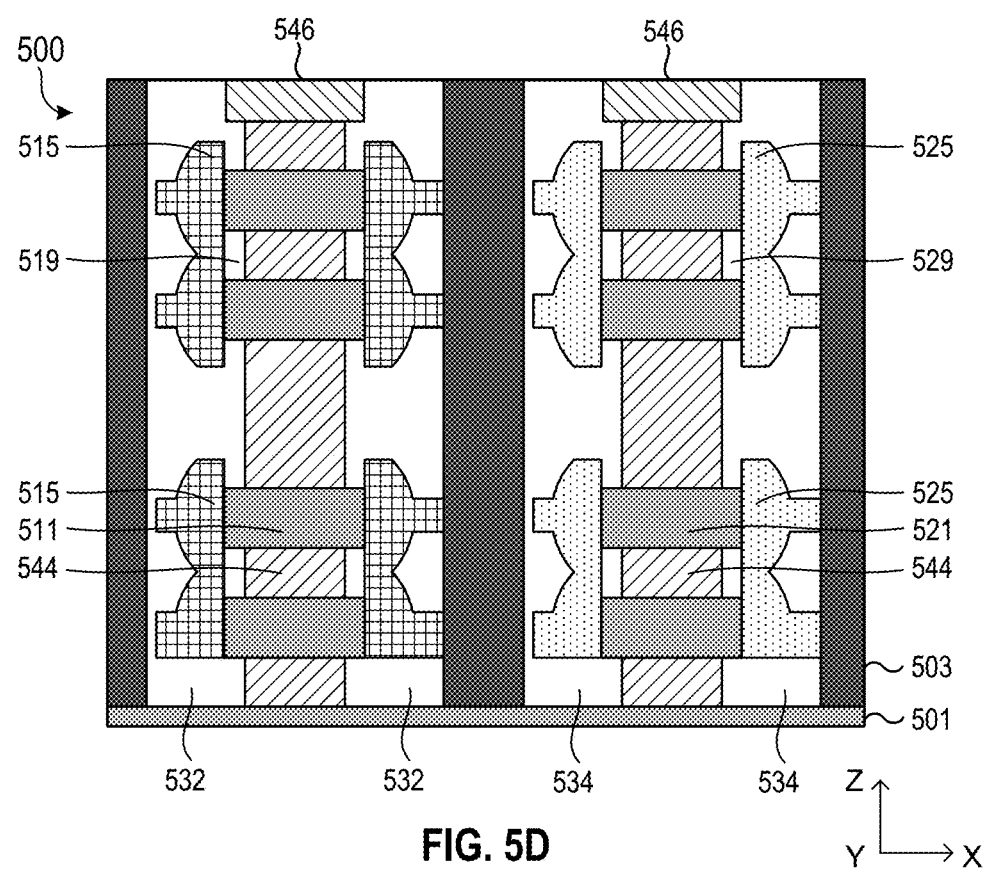

In FIG. 5D, first S/D regions 515 (e.g. p-type silicon) and inner spacers 519 are formed, for example in a process similar to FIGS. 5B and 5C. The first S/D regions 515 can correspond to the first S/D regions 215. The inner spacers 519 can correspond to the inner spacers 219. A dielectric material 532 can correspond to the dielectric material 232.

Figure 5E:
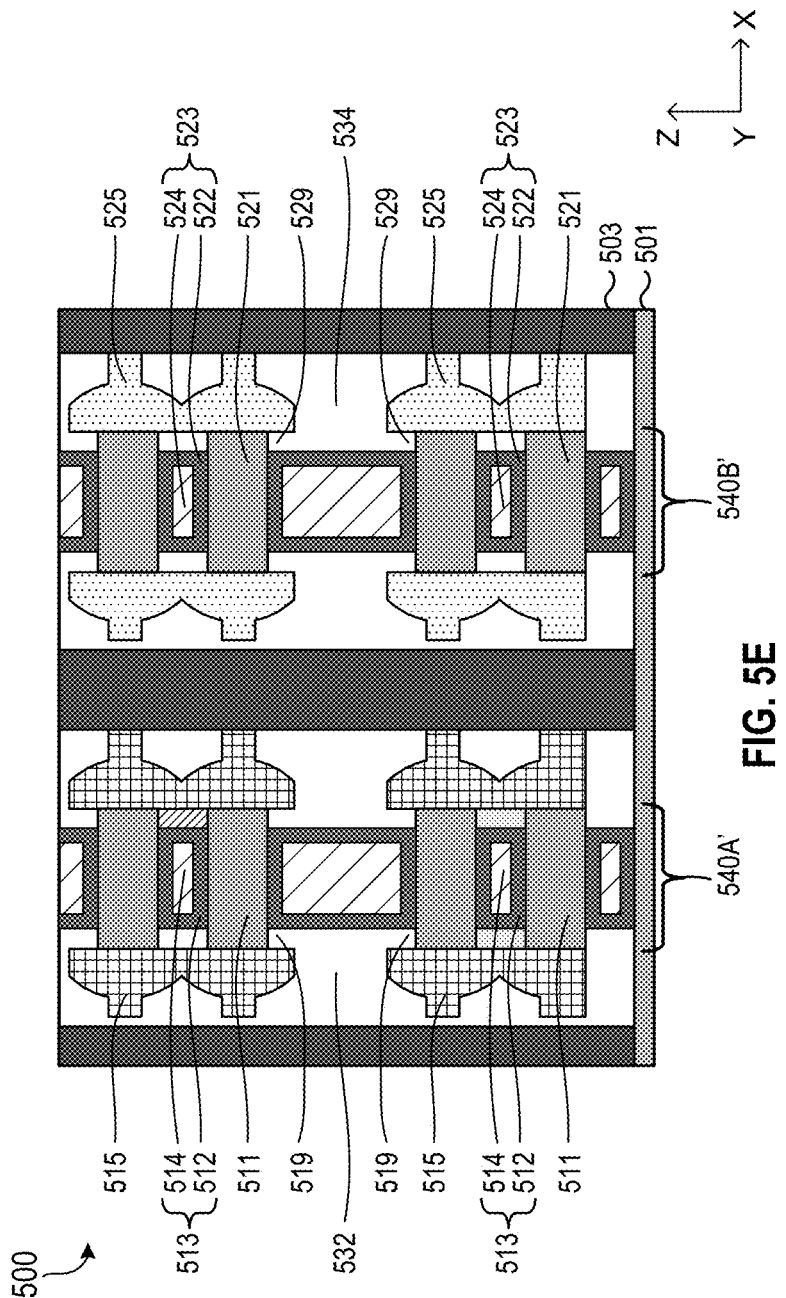

In FIG. 5E, the sacrificial gate layers 544 are replaced with first gate structures 513 and second gate structures 523. The first gate structures 513 can correspond to the first gate structures 213 while the second gate structures 523 can correspond to the second gate structures 223. Specifically, WFMs 514 and 524 can correspond to the WFMs 214 and 224 respectively. Gate dielectrics 512 and 522 can correspond to the gate dielectrics 212 and 222 respectively.

In one embodiment, the first gate structures 513 and the second gate structures 523 are formed in a same etching and deposition process. That is, second portions (not shown) of the sidewall structures 505 and second portions (not shown) of the sidewall structure 507 are removed to uncover one or more second sides (e.g. the −Y and +Y sides) of the first initial stack 540A' and uncover one or more second sides (e.g. the −Y and +Y sides) of the second initial stack 540B' respectively. The sacrificial gate layers 544 can then be removed from the second sides of the first initial stack 540A' and from the second sides of the second initial stack 540B'. Subsequently, the gate dielectrics 512 and 522, which can include one or more same dielectric materials, are formed on uncovered surfaces, particularly on uncovered surfaces of the first channel structures 511 and the second channel structures 521 respectively. For example, the gate dielectrics 512 and 522 can be formed by ALD. Next, the WFMs 514 and 524, which can include one or more same metal materials, are formed on the gate dielectrics 512 and 522 respectively and optionally planarized by CMP. In another embodiment, the first gate structures 513 and the second gate structures 523 are formed in separate processes. Accordingly, the gate dielectrics 512 and 522 may include different materials. The WFMs 514 and 524 may include different materials.

In yet another embodiment (not shown), the gate dielectrics 512 and 522 can be selectively deposited on uncovered surfaces of the first channel structures 511 and the second channel structures 521 respectively. As a result, the gate structures can correspond to the first gate structures 117 and the second gate structures 127. That is, at least one WFM can be separated from a respective S/D region by a respective inner spacer alone in the X direction. In other words, the at least one WFM is in direct contact with the inner spacers in the X direction (with no gate dielectric disposed in between).

Referring back to FIG. 5E, in some embodiments, a dielectric material, such as the first dielectric material 503 can be deposited, patterned (for example with a connector mask) and etched to open desired contact surfaces (e.g. the first S/D regions 515, the second S/D regions 525 and the WFMs 514 and 524). Then, contact structures, which correspond to the contact structures 261a, 261b, 262a and 262b, can be formed, for example by depositing a metal and planarized. The semiconductor device 500 can thus become the semiconductor device 200.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of microfabrication, the method comprising:
    forming an initial stack of semiconductor layers by epitaxial growth over a substrate, the initial stack of semiconductor layers comprising channel structures and sacrificial gate layers stacked alternatingly in a vertical direction substantially perpendicular to a working surface of the substrate, the channel structures comprising a first channel structure and a second channel structure positioned above the first channel structure, wherein the initial stack of semiconductor layers is surrounded by a sidewall structure;
    removing first portions of the sidewall structure to uncover first sides of the initial stack;
    forming source/drain (S/D) regions on uncovered side surfaces of the channel structures from the first sides of the initial stack;
    removing second portions of the sidewall structure to uncover second sides of the initial stack; and
    replacing the sacrificial gate layers with gate structures from the second sides of the initial stack.

2. The method of claim 1, further comprising:
    forming indentations by removing end portions of the sacrificial gate layers from the first sides of the initial stack; and
    forming inner spacers in the indentations.

3. The method of claim 1, wherein the replacing the sacrificial gate layers with the gate structures comprises:
    forming the gate structures all around respective channel structures.

4. The method of claim 1, wherein the replacing the sacrificial gate layers with the gate structures comprises:
    forming at least one gate dielectric of the gate structures over uncovered portions of the channel structures; and forming at least one work function metal (WFM) of the gate structures over the at least one gate dielectric.

5. The method of claim 4, wherein the forming the at least one gate dielectric of the gate structures comprises:
selectively depositing the at least one dielectric on the uncovered portions of the channel structures.

6. The method of claim 1, wherein the forming the initial stack of semiconductor layers comprises:
forming a first layer of a first dielectric material on a surface of a first semiconductor material over the substrate;
forming an initial opening within the first layer, the initial opening uncovering the first semiconductor material;
forming the sidewall structure within the initial opening such that the first semiconductor material is uncovered by an inner opening through the sidewall structure, the sidewall structure including a second dielectric material; and
forming the initial stack of semiconductor layers within the inner opening.

7. The method of claim 1, wherein:
the S/D regions are formed on the uncovered side surfaces of the channel structures by epitaxial growth.

8. A method of microfabrication, the method comprising:
forming an initial stack of semiconductor layers by epitaxial growth over a substrate, the initial stack of semiconductor layers comprising channel structures and sacrificial gate layers stacked alternatingly in a vertical direction substantially perpendicular to a working surface of the substrate, the channel structures comprising a first channel structure and a second channel structure positioned above the first channel structure, wherein the initial stack of semiconductor layers is surrounded by a sidewall structure;
removing first portions of the sidewall structure to uncover first sides of the initial stack;
forming source/drain (S/D) regions on uncovered side surfaces of the channel structures from the first sides of the initial stack;
removing second portions of the sidewall structure to uncover second sides of the initial stack; and
replacing the sacrificial gate layers with gate structures from the second sides of the initial stack,
wherein the forming the S/D regions comprises:
forming a protective structure to cover respective side surfaces of the second channel structure from the first sides of the initial stack; and
forming first S/D regions of the S/D regions on respective side surfaces of the first channel structure.

9. The method of claim 8, further comprising:
depositing a first filler material to cover the respective side surfaces of the first channel structure from the first sides of the initial stack;
forming the protective structure over the first filler material while leaving the first filler material partially uncovered; and
selectively etching the first filler material to uncover the respective side surfaces of the first channel structure.

10. The method of claim 9, wherein the forming the protective structure comprises:
depositing a second filler material over the first filler material to cover the respective side surfaces of the second channel structure, wherein the first filler material and the second filler material are etch selective to each other; and directionally etching the second filler material to partially uncover the first filler material such that a remaining portion of the second filler material forms the protective structure.

11. The method of claim 8, further comprising:
removing the protective structure; and
forming second S/D regions of the S/D regions on the respective side surfaces of the second channel structure.

12. The method of claim 8, further comprising:
forming indentations by removing end portions of the sacrificial gate layers from the first sides of the initial stack; and
forming inner spacers in the indentations.

13. The method of claim 8, wherein the replacing the sacrificial gate layers with the gate structures comprises:
forming the gate structures all around respective channel structures.

14. The method of claim 8, wherein the replacing the sacrificial gate layers with the gate structures comprises:
forming at least one gate dielectric of the gate structures over uncovered portions of the channel structures; and
forming at least one work function metal (WFM) of the gate structures over the at least one gate dielectric.

15. The method of claim 14, wherein the forming the at least one gate dielectric of the gate structures comprises:
selectively depositing the at least one dielectric on the uncovered portions of the channel structures.

16. The method of claim 8, wherein the forming the initial stack of semiconductor layers comprises:
forming a first layer of a first dielectric material on a surface of a first semiconductor material over the substrate;
forming an initial opening within the first layer, the initial opening uncovering the first semiconductor material;
forming the sidewall structure within the initial opening such that the first semiconductor material is uncovered by an inner opening through the sidewall structure, the sidewall structure including a second dielectric material; and
forming the initial stack of semiconductor layers within the inner opening.

17. A method of microfabrication, the method comprising:
forming an initial stack of semiconductor layers by epitaxial growth over a substrate, the initial stack of semiconductor layers comprising channel structures and sacrificial gate layers stacked alternatingly in a vertical direction substantially perpendicular to a working surface of the substrate, the channel structures comprising a first channel structure and a second channel structure positioned above the first channel structure, wherein the initial stack of semiconductor layers is surrounded by a sidewall structure;
removing first portions of the sidewall structure to uncover first sides of the initial stack;
forming source/drain (S/D) regions on uncovered side surfaces of the channel structures from the first sides of the initial stack;
removing second portions of the sidewall structure to uncover second sides of the initial stack; and
replacing the sacrificial gate layers with gate structures from the second sides of the initial stack,
wherein the sacrificial gate layers including one or more first sacrificial gate layers in direct contact with the first channel structure and one or more second sacrificial gate layers in direct contact with the second channel structure, the replacing the sacrificial gate layers with the gate structures comprises:

forming a protective structure to cover respective side surfaces of the one or more second sacrificial gate layers from the second sides of the initial stack; and replacing the one or more first sacrificial gate layers with one or more first gate structures.

18. The method of claim 17, further comprising:

removing the protective structure; and replacing the one or more second sacrificial gate layers with one or more second gate structures.

19. The method of claim 18, further comprising:

forming an isolation structure between the one or more first gate structures and the one or more second gate structures.

20. The method of claim 17, wherein the removing the second portions of the sidewall structure comprises:

removing upper parts of the second portions of the sidewall structure before the forming the protective structure; and removing lower parts of the second portions of the sidewall structure after the forming the protective structure.

* * * * *